US012384715B2

(12) United States Patent
Berlinguette et al.

(10) Patent No.: US 12,384,715 B2
(45) Date of Patent: Aug. 12, 2025

(54) PHOTODEPOSITION OF METAL OXIDES FOR ELECTROCHROMIC DEVICES

(71) Applicant: Miru Smart Technologies Corp., Vancouver (CA)

(72) Inventors: Curtis Berlinguette, Vancouver (CA); Wei Cheng, Vancouver (CA)

(73) Assignee: Miru Smart Technologies Corp., Vancouver (CA)

( * ) Notice: Subject to any disclaimer, the term of this patent is extended or adjusted under 35 U.S.C. 154(b) by 0 days.

(21) Appl. No.: 16/632,636

(22) PCT Filed: Jul. 20, 2018

(86) PCT No.: PCT/CA2018/050885
§ 371 (c)(1),
(2) Date: Jan. 21, 2020

(87) PCT Pub. No.: WO2019/014776
PCT Pub. Date: Jan. 24, 2019

(65) Prior Publication Data
US 2020/0165161 A1 May 28, 2020

Related U.S. Application Data

(60) Provisional application No. 62/534,785, filed on Jul. 20, 2017.

(51) Int. Cl.
*B05D 3/06* (2006.01)
*B05D 5/12* (2006.01)
(Continued)

(52) U.S. Cl.
CPC .............. *C03C 17/25* (2013.01); *B05D 3/065* (2013.01); *B05D 5/12* (2013.01); *C03C 17/256* (2013.01);
(Continued)

(58) Field of Classification Search
CPC . C03C 17/25; C03C 17/256; C03C 2218/116; C03C 17/32; G02F 1/1524;
(Continued)

(56) References Cited

U.S. PATENT DOCUMENTS 3,669,724 A 6/1972 Warren
4,996,083 A * 2/1991 Moser ................. C03C 17/3417
427/126.3

(Continued)

FOREIGN PATENT DOCUMENTS

CA 2991892 1/2017
CN 1560185 1/2006
(Continued)

OTHER PUBLICATIONS

Azens et al., "Ozone coloration of Ni and Cr oxide films," Solar Energy Materials & Solar Cells, 2003, pp. 147-153, vol. 76.
(Continued)

*Primary Examiner* — Brian K Talbot
(74) *Attorney, Agent, or Firm* — Ahmann Kloke LLP

(57) ABSTRACT

The present invention provides scalable, solution based processes for manufacturing electrochromic materials comprising metal oxide films for use in electrochromic devices. The electrochromic material comprises a transparent conductive substrate coated with an electrochromic metal oxide film, wherein the metal oxide film is formed by a process comprising the steps of: a) providing the conductive substrate; b) coating the substrate with a solution of one or more metal precursors; and c) exposing the coated substrate to near-infrared radiation, UV radiation and/or ozone in an aerobic atmosphere. The present invention also provides electrochromic devices incorporating these electrochromic materials.

20 Claims, 18 Drawing Sheets

(51) Int. Cl.
*C03C 17/25* (2006.01)
*C23C 14/08* (2006.01)
*C23C 14/58* (2006.01)
*C23C 16/40* (2006.01)
*G02F 1/1523* (2019.01)
*G02F 1/1524* (2019.01)

(52) U.S. Cl.
CPC ........ *C23C 14/088* (2013.01); *C23C 14/5853* (2013.01); *C23C 16/40* (2013.01); *G02F 1/1524* (2019.01); *G02F 1/1525* (2013.01); *C03C 2217/212* (2013.01); *C03C 2217/217* (2013.01); *C03C 2217/218* (2013.01); *C03C 2217/219* (2013.01); *C03C 2218/116* (2013.01); *C03C 2218/32* (2013.01)

(58) Field of Classification Search
CPC ......... G02F 1/1525; B05D 1/005; B05D 1/02; B05D 1/18; B05D 3/065; B05D 5/12; C23C 13/08; C23C 13/088; C23C 13/5853; C23C 16/40
USPC .......................................................... 427/58
See application file for complete search history.

(56) References Cited

U.S. PATENT DOCUMENTS

| | | | |
|---|---|---|---|
| 5,034,246 | A | 7/1991 | Mance et al. |
| 5,384,157 | A | 1/1995 | Tambo |
| 5,384,653 | A * | 1/1995 | Benson ................. E06B 3/6722 359/265 |
| 5,470,673 | A | 11/1995 | Tseung et al. |
| 5,661,092 | A * | 8/1997 | Koberstein ............ B05D 3/067 427/515 |
| 5,772,978 | A | 6/1998 | Bailey et al. |
| 5,825,526 | A * | 10/1998 | Bommarito ....... B32B 17/10174 359/265 |
| 5,834,157 | A | 11/1998 | Scheler |
| 5,871,853 | A * | 2/1999 | Azuma ............... C23C 18/1216 428/689 |
| 6,074,471 | A * | 6/2000 | Foot ........................ B01J 13/00 106/287.18 |
| 6,582,972 | B1 * | 6/2003 | Joshi ...................... C30B 29/68 257/E21.272 |
| 6,859,297 | B2 | 2/2005 | Lee et al. |
| 7,564,611 | B2 | 7/2009 | Jang et al. |
| 8,432,603 | B2 | 4/2013 | Wang et al. |
| 8,687,261 | B2 | 4/2014 | Gillaspie et al. |
| 8,894,827 | B2 | 11/2014 | Jiang et al. |
| 9,905,414 | B2 * | 2/2018 | Gordon .................. C01B 13/34 |
| 10,804,098 | B2 * | 10/2020 | Raisanen .......... H01L 21/02172 |
| 2002/0047148 | A1 * | 4/2002 | Won ........................ H01L 28/60 257/296 |
| 2004/0266211 | A1 * | 12/2004 | Tao ........................ H01L 21/306 438/770 |
| 2010/0071810 | A1 * | 3/2010 | Nadaud ................... C03C 17/36 148/400 |
| 2010/0245973 | A1 * | 9/2010 | Wang .................... C23C 14/086 359/275 |
| 2011/0260124 | A1 * | 10/2011 | Gillaspie ............ C23C 18/1258 427/523 |
| 2012/0090679 | A1 * | 4/2012 | Chittibabu ........... H10K 30/151 136/256 |
| 2012/0212794 | A1 | 8/2012 | Giron et al. |
| 2013/0101867 | A1 | 4/2013 | Yukinobu et al. |
| 2013/0286459 | A1 | 10/2013 | Burdis et al. |
| 2014/0043666 | A1 * | 2/2014 | Weir ...................... H01M 4/525 359/265 |
| 2014/0220362 | A1 | 8/2014 | Milliron et al. |
| 2015/0225845 | A1 * | 8/2015 | Park ...................... C23C 16/047 118/724 |
| 2016/0005879 | A1 * | 1/2016 | Takata .............. H01L 29/66969 257/43 |
| 2017/0075182 | A1 * | 3/2017 | Nguyen ................. G02F 1/1347 |
| 2017/0239931 | A1 * | 8/2017 | Wolk ..................... B32B 37/025 |
| 2017/0316847 | A1 | 11/2017 | Hitosugi |
| 2019/0023981 | A1 * | 1/2019 | Van Der Boom .... G02F 1/1516 |

FOREIGN PATENT DOCUMENTS

| | | |
|---|---|---|
| CN | 103814107 | 5/2014 |
| EP | 0493043 A2 | 7/1992 |
| JP | S58110444 A | 4/1987 |
| JP | H04300212 A | 10/1992 |
| JP | H05306144 A | 11/1993 |
| JP | 5306144 | 10/2013 |
| JP | 2016509689 | 3/2016 |
| KR | 10-2011-0057257 | 5/2011 |
| KR | 10-2012-0085242 | 7/2012 |
| KR | 20170040615 | 4/2017 |
| KR | 10-2017-0063749 | 6/2017 |
| WO | 2010/047177 | 4/2010 |
| WO | 2011/155635 | 12/2011 |
| WO | 2013/013135 | 1/2013 |
| WO | 2013141375 A1 | 9/2013 |
| WO | 2014025876 A2 | 2/2014 |
| WO | 2014/113796 | 7/2014 |
| WO | 2016101067 A1 | 6/2016 |
| WO | WO-2016088882 A1 * | 6/2016 ............. H01L 27/08 |

OTHER PUBLICATIONS

Azens et al., "Sputter-deposited nickel oxide for electrochromic applications," Solid State Ionics, 1998, pp. 449-456, vol. 113-115.
Brezesinski et al., "Highly Crystalline WO3, Thin Films with Ordered 3D Mesoporosity and Improved Electrochromic Performance," Small, 2006, pp. 1203-1211, vol. 2, No. 10.
Cai et al., "Inkjet-printed all solid-state electrochromic devices based on NiO/WO3 nanoparticle complementary electrodes," Nanoscale, 2016, pp. 348-357, vol. 8.
Cheng et al., "Synthesis and electrochromic properties of mesoporous tungsten oxide," J. Mater. Chem., 2001, pp. 92-97, vol. 11.
Chiang et al., "Fuel-Assisted Solution Route to Nanostructured Nickel Oxide Films for Electrochromic Device Application," ACS Appl. Mater. Interfaces, 2013, pp. 6502-6507, vol. 5.
Dalavi et al., "Electrochromic performance of sol-gel deposited NiO thin film," Materials Letters, 2013, pp. 60-63, vol. 90.
Decker et al., "The Electrochromic Process in Non-Stoichiometric Nickel Oxide Thin Film Electrodes," Electrochimica Acta, 1992, pp. 1033-1038, vol. 37, No. 6.
Estrada et al., "Electrochromic nickel-oxide-based coatings made by reactive dc magnetron sputtering: Preparation and optical properties," J. Appl. Phys., Oct. 1, 1988, pp. 3678-3683.
Gillaspie et al., "Metal oxide films for electrochromic applications: present technology and future directions," J. Mater. Chem, 2010, pp. 9585-9592, vol. 20.
Hsu et al., "Electrochromic properties of nanocrystalline MoO3 thin films," Thin Solid Films, 2008, pp. 4839-4844, vol. 516.
Korošec et al., "The role of thermal analysis in optimization of the electrochromic effect of nickel oxide thin films, prepared by the sol-gel method: Part II," Thermochimica Acta, 2004, pp. 65-71, vol. 410.
Liang et al., "High-performance flexible electrochromic device based on facile semiconductor-to-metal transition realized by WO3 2H2O ultrathin nanosheets," Scientific Reports, 2013, 8 pages, vol. 3, Article No. 1936.
Liao et al., "WO3-x nanowires based electrochromic devices," Solar Energy Materials & Solar Cells, 2006, pp. 1147-1155, vol. 90.
Liu et al., "Ultrthin W18O49 Nanowire Assemblies for Electrochromic Devices," Nano Lett., 2013, pp. 3589-3593, vol. 13.
Liu et al., "Electrolytes-relevant cyclic durability of nickel oxide thin films as an ion-storage layer in an all-solid-state complementary electrochromic device," Solar Energy Materials & Solar Cells, 2016, pp. 844-852, vol. 157.
Livage et al., "Sol-gel electrochromic coatings and devices: A review," Solar Energy Materials & Solar Cells, 2001, pp. 365-381, vol. 68.

(56) References Cited

OTHER PUBLICATIONS

Llordés et al., "Linear topology in amorphous metal oxide electrochromic networks obtained via low-temperature solution processing," Nature Materials, Dec. 2016, pp. 1267-1273, vol. 15.
Mahmoud et al., "Electrochromic characterisation of electrochemically deposited nickel oxide films," Physica B, 2000, pp. 125-131, vol. 293.
Maruyama et al., "Electrochromic Properties of Molybdenum Trioxide Thin Films Prepared by Chemical Vapor Deposition," J. Electrochem. Soc., May 1995, pp. 1644-1647, vol. 142, No. 5.
Mortimer, Roger J., "Electrochromic Materials," Annu. Rev. Mater. Res., 2011, pp. 241-268, vol. 41.
Nakaoka et al., "Semiconductor and electrochromic properties of electrochemically deposited nickel oxide films," Journal of Electroanalytical Chemistry, 2004, pp., 93-99, vol. 571.
Niklasson et al., "Electrochromics for smart windows: thin films of tungsten oxide and nickel oxide, and devices based on these," J. Mater. Chem., 2007, pp. 127-156, vol. 17.
Passerini et al., "An Electrochromic Window Based on LixWO3/(PEO)8LiClO4/NiO," J. Electrochem. Soc., Nov. 1989, pp. 3394-3395, vol. 136, No. 11.
Passerini et al., "The Intercalation of Lithium in Nickel Oxide and Its Electrochromic Properties," J. Electrochem. Soc., Oct. 1990, pp. 3297-3300, vol. 137, No. 10.
Runnerstrom et al., "Nanostructured electrochromic smart windows: traditional materials and NIR-selective plasmonic nanocrystals," Chem. Commun., 2014, pp. 10555-10572, vol. 50.
Salvatore et al., "Near-infrared-driven decomposition of metal precursors yields amorphous electrocatalytic films," Sci. Adv., Mar. 2015, 6 pages.
Scherer et al., "Enhanced Electrochromism in Gyroid-Structured Vanadium Pentoxide," Adv. Mater., 2012, pp. 1217-1221, vol. 24.
Smith et al., "Photochemical Route for Accessing Amorphous Metal Oxide Materials for Water Oxidation Catalysis," Science, Apr. 5, 2013, pp. 60-63, vol. 340.
Srivastava et al., "Microstructural and electrochromic characteristics of electrodeposited and annealed WO3 films," Solid State Ionics, 2005, pp. 1161-1168, vol. 176.
Svensson et al., "Electrochromic hydrated nickel oxide coatings for energy efficient windows: Optical properties and coloration mechanism," Appl. Phys. Lett., Dec. 8, 1986, pp. 1566-1568, vol. 49, No. 23.
Tong et al., "Novel morphology changes from 3D ordered macroporous structure to V2O5 nanofiber grassland and its application in electrochromism," Scientific Reports, 2015, 11 pages.
Wen et al., "Anodic Electrochromism for Energy-Efficient Windows: Cation/Anion-Based Surface Processes and Effects of Crystal Facets in Nickel Oxide Thin Films," Adv. Funct. Mater., 2015, pp. 3359-3370, vol. 25.
Wen et al., "Electrochromic nickel oxide films and their compatibility with potassium hydroxide and lithium perchlorate in propylene carbonate: Optical, electrochemical and stress-related properties," Thin Solid Films, 2014, pp. 128-135, vol. 565.
Wen et al., "Electrochromic performance of Ni oxide thin films intercalated with Li+ ions," INERA Workshop of SCMP2014, Journal of Physics: Conference Series, 2014, 6 pages, vol. 559.
Wu et al., "Resistive Switching Behavior and Multiple Transmittance States in Solution-Processed Tungsten Oxide," ACS Appl. Mater. Interfaces, 2011, pp. 2616-2621, vol. 3.
Zhang et al., "An all-solid-state electrochromic device based on NiO/WO3 complementary structure and solid hybrid polyelectrolyte," Solar Energy Materials & Solar Cells, 2009, pp. 1840-1845, vol. 93.
Zhang et al., "Hydrothermally synthesized WO3 nanowire arrays with highly improved electrochromic performance," J. Mater. Chem., 2011, pp. 5492-5498, vol. 21.
Gesheva et al., "Optical Coatings of CVD-Transition Metal Oxides as Functional Layers in "Smart Windows" and X-ray Mirrors," Journal of Optoelectronics and Advanced Materials, 2005, pp. 1243-1252, vol. 7, No. 3.
Jeon et al., "Amorphous Tungstate Precursor Route to Nanostructure Tungsten Oxide Film with Electrochromic Property," Nanotechnology, 2011, pp. 6518-6522, vol. 11, No. 7 (Abstract Only).
European Patent Office, Extended European Search Report mailed on May 25, 2021, issued in connection with European Patent Application No. 18834936.9, 6 pages.
Japanese Patent Office, Office Action issued on Aug. 30, 2022 in connection with Japanese Patent Application No. JP2020-524658, 7 pages.
Japanese Office Action dated Apr. 25, 2023 issued in Japanese Patent Application No. 2020-524658.
Canadian Intellectual Property Office, Exam Report issued on Apr. 2, 2024 in connection with Canadian Patent application No. 3,070,511, 3 pages.
China National Intellectual Property Administration, Exam Report issued on Mar. 1, 2023 in connection with Chinese Patent application No. 201880048500.9 and English translation, 15 pages.
China National Intellectual Property Administration, Exam Report issued on Mar. 20, 2024 in connection with Chinese Patent application No. 201880048500.9 and English translation, 13 pages.
China National Intellectual Property Administration, Exam Report issued on Oct. 19, 2023 in connection with Chinese Patent application No. 201880048500.9 and English translation, 11 pages.
Japanese Patent Office, Office Action issued on Apr. 25, 2023 in connection with Japanese Patent application No. 2020-524658 and English translation, 11 pages.
Japanese Patent Office, Office Action issued on Aug. 30, 2022 in connection with Japanese Patent application No. 2020-524658 and English translation, 14 pages.
Japanese Patent Office, Office Action issued on Jan. 16, 2024 in connection with Japanese Patent application No. 2020-524658 and English translation, 11 pages.
Japanese Patent Office, Search Report issued on Jul. 12, 2022 in connection with Japanese Patent Application No. 2020-524658 and English translation, 61 pages.
Jeon et al., "Amorphous Tungstate Precursor Route to Nanostructure Tungsten Oxide Film with Electrochromic Property," Journal of Nanoscience and Nanotechnology, 2011, pp. 6518-6522, vol. 11, No. 7.
Korean Intellectual Property Office, Notice of Reasons for Rejection issued on Apr. 17, 2023 in connection with Korean Patent application No. 10-2020-7004856, and English translation, 12 pages.
Korean Intellectual Property Office, Notice of Reasons for Rejection issued on Feb. 29, 2024 in connection with Korean Patent application No. 10-2020-7004856, and English translation, 6 pages.

\* cited by examiner

PHOTODEPOSITION OF METAL OXIDES FOR ELECTROCHROMIC DEVICES

CROSS-REFERENCE TO RELATED APPLICATIONS

This application is a national stage application under 35 U.S.C. § 371 of International Application No. PCT/CA2018/050885, filed Jul. 20, 2018, which claims the benefit of priority from U.S. Provisional Application No. 62/534,785, filed Jul. 20, 2017. The disclosures of all of the above applications are incorporated by reference herein in their entireties.

FIELD OF INVENTION

The present invention relates to electrochromic films. More particularly, the present invention relates to processes for fabricating electrochromic metal oxide films for use in electrochromic devices.

BACKGROUND

Heating, ventilating, and air conditioning (HVAC) of buildings account for 30-40% of global primary energy consumption. Altering the optical and thermal properties of windows can reduce the energy deficit of a building by up to 40%. It is therefore imperative to develop technologies to dynamically adjust the transmittance of windows to reduce the energy consumption of buildings, as the ability to dynamically control window opacity to sunlight can provide the opportunity to reduce energy consumption by 20% and lighting costs by up to 50% for commercial buildings.

Electrochromic windows (also known as smart or dynamic windows) undergo changes in light transmittance in response to an applied voltage, enabling dynamic control of the daylight and solar heat passing through buildings. Hence, this technology can provide indoor thermal and visual comfort for building occupants and also improve building energy efficiency. This energy-conservation technology has gained tremendous attention in industry, and in recent years, some glass companies have raised over 1 billion dollars to commercial electrochromic technology. Although large capital and efforts has been invested into this technology, the high price of electrochromic windows on the market has prevented its widespread adoption as a building material.

A typical electrochromic (EC) device has a multilayer architecture consisting of active electrochromic layer, electrolyte layer, ion storage layer (counter electrode) layer, transparent conductors and supporting substrates. Among these layers, electrochromic and ion storage layers are the key components contributing to the reversible color switching. Metal oxide layers may be employed as the active electrochromic layer and/or in the ion storage layer. The most well-known electrochromic material coating used in the active electrochromic layer is $WO_3$, which can switch reversibly and persistently between dark blue and colorless states during the operation of the device.

Generating electrochromic metal oxide layers is therefore a critical step in the manufacture of electrochromic cells. Sputtering is the most common technique used today to generate these electrochromic films, but this method requires vacuum and high temperatures energy to operate. Alternative techniques that have been tried to make these layers include evaporation, chemical vapour deposition, electrodeposition, sol-gel techniques, laser ablation, sputtering and thermal deposition, but drawbacks such as cost, scalability, and obtaining the desired compositions have prevented these techniques from replacing sputtering as the industry standard.

There is therefore a clear need for an alternative metal-oxide deposition process to the existing, onerous and expensive sputtering techniques that are commonly used to produce the electrochromic or light absorbing films.

SUMMARY OF INVENTION

An object of the present invention is to provide scalable, solution based processes for the photodeposition of metal oxides for use in electrochromic devices. In accordance with an aspect of the present invention, there is provided an electrochromic material for use in an electrochromic device, the electrochromic material comprising a transparent conductive substrate coated with an electrochromic metal oxide film, wherein the metal oxide film is formed by a process comprising the steps of: a) providing the conductive substrate; b) coating the substrate with a solution of one or more metal precursors; and c) exposing the coated substrate to near-infrared radiation, UV radiation and/or ozone in an aerobic atmosphere to convert the one or more metal precursors to the metal oxide film on the conductive substrate, thereby forming the electrochromic material.

In accordance with another aspect of the present invention, there is provided an electrochromic device comprising: (a) a first electrode comprising an electrochromic material prepared in accordance with the present methods, (b) a counter electrode, and (c) an ion-conductor layer for conducting ions between said first electrode and the counter electrode.

DETAILED DESCRIPTION OF THE INVENTION

Definitions

Figure 1:
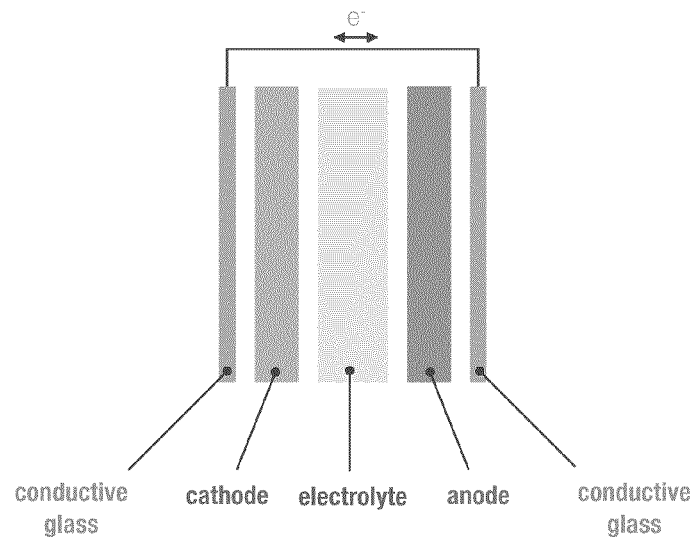
FIG. 1 is a schematic depiction of an electrochromic cell and its components.

"Amorphous" means a chemical composition without long-range order in its atomic structure.

"Electrochromic cell" refers to a cell that is capable of transitioning transparency from a colored state (i.e., low transmittance of light through the window) to a transparent state (i.e., high transmittance of light through the window), and/or from a transparent state to a colored state, through the use of an applied electrical bias. The "transparent" state may also be referred to as a "bleached" state.

"Ligand" means any chemical group coordinated, chemically bonded or ionically bonded to a metal. Typical ligand examples are, but not limited to, chloride, bromide, nitrate, 2-ethylhexanoate and acetylacetonate.

"Metal Oxide" may refer herein to any single solid containing a metal and oxygen, where the ratio of metal to oxygen is undefined and therefore represented as $MO_x$. Examples of single metal oxides that may be suitable for use as an electrochromic material include, but are not limited to, $NiO_x$, $WO_3$, $MoO_3$, $TiO_2$, $Ta_2O_5$, $V_2O_5$, $Nb_2O_5$, $COO_2$, $MnO_2$, and $FeO_x$.

"Mixed Metal Oxide" refers to a film that contains at least two metals and is an oxide. Examples of mixed metal oxides that may be suitable for use as an electrochromic material include, but are not limited to, $LiNiO_x$, $TiWO_x$, and $FeNiO_x$.

"Metal Precursor" describes any chemical containing a metal that is deposited onto a substrate and then converted into a metal oxide. Typical examples include, but are not limited to, metal chloride, metal 2-ethylhexanoate and metal acetylacetonate, wherein the metal may be any of the metals identified above.

"Reduced Iron Oxide" refers to the compound FeO where iron and oxygen are present in nearly equal amounts.

"Sputtering" refers to a technique whereby a pure metal is exposed to high energy that ejects atoms of the metal into a medium with the atoms subsequently being deposited onto a substrate.

"Substrate" refers to the material upon which the metal oxide coating is assembled. The substrate material may be inherently conductive, or the conductivity may be engendered through application of a conductive film to the surface of the material. A suitable film typically comprises a transparent conductive oxide (TCO) such as fluorine tin oxide (FTO); indium tin oxide (ITO); aluminum zinc oxide (AZO) and various others. Other suitable support materials include any transparent glasses, plastics, polymers (e.g. PET), or rubbers compatible with a relevant conductive layer.

This present invention relates to electrochromic devices comprising electrochromic metal oxide and/or mixed-metal oxide films produced using scalable fabrication processes which do not require a vacuum, and which may be carried out at an ambient or elevated temperature.

An objective of the present invention is therefore to provide low cost, scalable, solution based processes for manufacturing an optical quality film of a metal oxide or mixed metal oxide coated on a suitable conductive substrate, for use in an electrochromic device. In accordance with the present invention, the metal oxide and/or mixed metal oxide films formed using the present processes are electrochromic, i.e., capable of transforming its transparency from the colored state to a transparent state (or transparent state to a colored state) upon the introduction of an external electrical bias.

The invention further provides photochemical methods suitable for the large-scale processing and manufacturing of the desired metal oxide and mixed metal oxide films, in amorphous or crystalline phases, for use in the electrochromic devices of the present invention.

The present disclosure describes two methods suitable for making metal oxides and mixed metal oxides for electrochromic devices: Near Infrared Driven Decomposition (NIRDD) or UV photodecomposition. Both NIRDD and UV photodecomposition are methods of manufacture that operate at lower temperatures with solution processable precursors that afford precise composition control and lower cost manufacturing than existing state-of-the-art techniques.

In one embodiment, there is provided a Near-Infrared Driven Decomposition (NIRDD) method, which uses infrared light to decompose a metal precursor to generate the corresponding metal oxide or mixed metal oxide, if formed in the presence of air. PCT Patent Publication No. WO2016101067 A1 describes an NIRDD method for the preparation of metal oxides and mixed-metal oxides, the entire disclosure of which is incorporated herein by reference.

In one embodiment, there is provided a UV photodecomposition method, in which the metal precursor is subjected to ultraviolet radiation, optionally in the presence of ozone, to remove all ligands and produce the desired metal or mixed-metal oxides under aerobic atmosphere. UV photodecomposition operates at either ambient or elevated temperatures. U.S. Pat. No. 9,433,928 describes a UV photodecomposition technique for generating metal oxides and mixed-metal oxides for use in methods for making electrocatalysts, the entire disclosure of which is incorporated herein by reference.

When carried out on a metal precursor in the absence of air, both UV photodecomposition and NIRDD can result in a more reduced phase of the corresponding metal.

The electrochromic metal oxide and/or mixed-metal oxide films formed using the methods of the present invention may be amorphous or crystalline.

In one embodiment of the present invention, the metal oxide or mixed metal oxide is formed on a transparent conductive oxide layer and subsequently incorporated into an electrochromic cell that is capable of transitioning from opaque to transparent or transparent to opaque through the use of an applied electrical bias.

In accordance with the present invention, one or more metal or mixed metal oxide coatings are employed as layers in an electrochromic cell that are incorporated into "smart glass" applications such as electrochromic windows.

The general configuration of an electrochromic device comprises an anode and cathode supported on transparent conductive substrates and an inter-electrode ion conductor (electrolyte). The anode and/or the cathode may comprise electrochromic material(s). The function of each component of the overall device is described in detail below, and a schematic depiction of the overall device architecture is presented in FIG. 1.

When a voltage is applied across the electrodes, an electric field is generated within the insulating electrochromic material, which can cause migration of ions to or from the electrochromic material producing colour changes in that electrochromic material (e.g., from bleached to colored when switched from one electrochromic state to another). By reversing the applied bias, the electrochromic material can be switched back (e.g., from colored to bleached state). The electrochromic material may also be colored initially, and switch to a colorless/bleached state with applied voltage, and then switched back to the colored state by reversing the applied bias. For example, tungsten oxide based films colour with ion insertion, whereas nickel oxide based films colour with ion extraction.

The role of the electrolyte layer in an electrochromic cell is to allow ions to travel between the anode and cathode materials. An example of a common electrolyte for electrochromic devices is $LiClO_4$ in propylene carbonate.

As such, a typical electrochromic device has a multilayer architecture consisting of active electrochromic layer, electrolyte layer, ion storage layer (counter electrode) layer, transparent conductors and supporting substrates. Among these layers, electrochromic and ion storage layers are the key components contributing to the reversible color switching.

A good electrochromic material exhibits a high colour contrast between its coloured and bleached states, has rapid conversion between coloured and bleached states, is capable of switching between colored and bleached at low applied voltage, shows excellent reversibility with cycling between states, and excellent stability.

In accordance with preferred embodiments of the present invention, the metal oxide and mixed-metal oxide films employed in the electrochromic devices comprise $NiO_x$, $WO_x$, $NbO_x$, $MoO_x$, $MnO_x$, $CoO_x$, $VO_x$, $TaO_x$, $TiO_x$ and $LiNiO_x$, or combinations thereof.

Another application for the metal or mixed metal oxide is to provide coatings on windows that preclude the entry of long wavelength solar radiation, alone or in combination with the electrochromic metal oxide coatings. In one embodiment, the light absorbing coating is provided by a reduced iron oxide film. The reduced iron oxide may be produced by either NIRDD or UV photodecomposition in an inert atmosphere such as nitrogen or argon. In all of these embodiments, a reduced iron oxide layer may be incorporated to block near-infrared light without affecting visible light, thereby serving to absorb near-infrared wavelengths while allowing visible light to pass through.

The most well-known electrochromic material coating that comprises the working electrode is $WO_3$ film that switches reversibly and persistently between dark blue and colorless states during the operation of the device.

Tungsten trioxide ("$WO_3$") is a well known cathodic electrochromic material that cycles between a pale yellow (or transparent) neutral and deep blue reduced state in electrochromic devices. The transparent film can be electrochemically reduced in the presence of lithium ions to form the colored, reduced state ("$LiWO_3$"), and reversibly re-oxidized to the transparent state. The methods of the present invention can be used to form $WO_x$ films for use in the electrochromic devices.

Examples of other electrochromic cathodic materials include, but are not limited to, $MoO_3$, $TiO_2$, $Ta_2O_5$, $V_2O_5$, $NiO_x$, and $Nb_2O_5$.

Nickel oxide ("$NiO_x$") is a known anodic electrochromic material that colours complementary to tungsten oxide to create a better colored dark state in the electrochromic cell. The methods of the present invention can be used to form $NiO_x$ films for use in the electrochromic devices.

Another example of a good anodic electrochromic material is $IrO_2$. Materials such as $CoO_2$, $MnO_2$ and $FeO_2$ have also been shown to exhibit electrochromic behavior, but are not ideal as they do not bleach completely.

Iron oxide ("FeO") is a material known for a high absorption of near-infrared light relative to visible light. It can be used for coatings on architectural glass to reduce interior solar heating of buildings. Thin films of FeO can be created by sputtering, or chemical vapor deposition under anoxic conditions.

Transparent conductive metal oxides (TCOs) such as tin doped indium oxide (ITO) and fluorine doped tin oxide (FTO) are frequently used as counter electrodes in isolation or coated with additional ion storage materials. Although devices with bare TCO for their counter electrode usually show better transparency in the bleached state, in such devices the charge is usually not balanced between the two electrodes, which may be detrimental to the device stability. The methods of the present invention can be used to form a stabilizing metal oxide ion storage layer.

A metal precursor or combination of metal precursors is/are coated onto a substrate that may include, but is not limited to, glass, plastic, composites, etc. In an embodiment of the present invention, the preferred substrate is transparent and is either glass or plastic.

Coating the chosen substrate can be performed using a variety of methods including spin coating, painting, dip coating, spray coating, ultra-sonic spray coating or other methods familiar to those skilled in the art. A coating solution is prepared by dissolving the metal precursor or precursors into a compatible solvent and then applying the solution to the surface of the substrate. Upon drying, a layer of the desired precursor or precursors is formed on the substrate. Examples of compatible solvents include but are not limited to, water, methanol, ethanol, isopropanol, acetone, hexane, acetylacetone, and methyl isobutyl ketone.

Metal precursors suitable for use in the processes of the present invention include any metal derivative that can be converted to the corresponding metal oxide upon exposure to near-infrared radiation, UV radiation and/or ozone. Suitable precursors include, but are not limited to, metal chlorides, metal 2-ethylhexanoate and metal acetylacetonates. Exemplary embodiments of metal precursors include $WCl_6$, $Ni(eh)_2$, $NiCl_2$, $VCl_3$, $NbCl_5$, $MoCl_5$, $Li(eh)$, $W(O-iPr)_6$ and $Ti(eh)_4$.

Either the NIRDD and/or UV photodecomposition method can be used to convert the metal precursor that is coated onto the substrate to the desired amorphous or crystalline metal oxide or mixed-metal oxide in air at ambient or elevated temperature. Forming a mixed-metal oxide using the sputtering technique is comparatively more onerous.

In one embodiment of the synthesis of a metal oxide film, a precursor solution is produced by dissolving the metal precursor in anhydrous ethanol. The precursor solution is then spin-coated on FTO glass, and the resultant precursor thin films are subjected to UV or NIR irradiation until decomposition is confirmed through monitoring of ligand loss using spectroscopic methods. To produce multi-layer thin films, the spin-coating and irradiation steps are repeated multiple times.

In certain embodiments, the as-deposited films undergo an annealing step in an oven in air at temperatures ranging from 50-750° C. for 1 hour using a ramping rate of 10° C./min. In one embodiment, the films undergo an annealing step at 100° C. for 1 hour. In one embodiment, the films undergo an annealing step at 200° C. for 1 hour. In one embodiment, the films undergo an annealing step at 200° C. for 1 hour. In one embodiment, the films undergo an annealing step at 600° C. for 1 hour.

Figure 2:
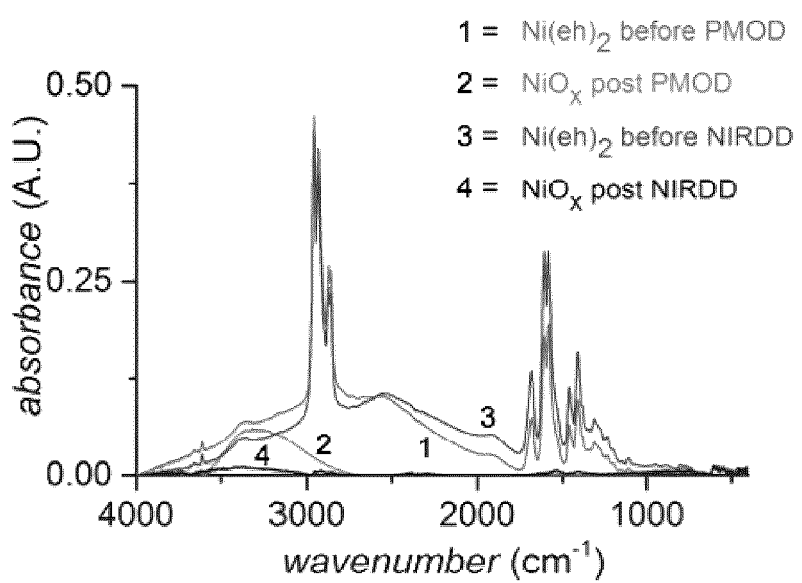
FIG. 2 depicts infrared spectra monitoring the decomposition of a nickel precursor into nickel oxide in accordance with a method of the present invention.

For precursors comprising organic ligands, formation of the desired metal oxide can be monitored by infrared spectroscopy, as loss of ligands from the metal precursor gives rise to a loss of ligand signal in the infrared spectrum. FIG. 2 depicts the transformation from the nickel 2-ethylhexanoate metal precursor to amorphous nickel oxide using both the UV photodecomposition and NIRDD methods.

For precursors which cannot be tracked by infrared spectroscopy, including but not limited to metal chloride salts, X-ray fluorescence (XRF) spectroscopy can be used to monitor the transformation to amorphous metal oxide.

Figure 3:
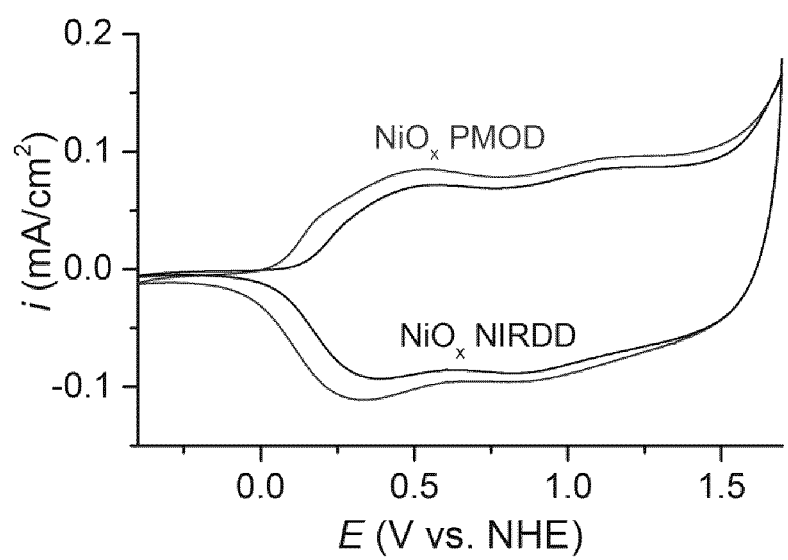
FIG. 3 depicts cyclic voltammograms of nickel oxide prepared by UV photodecomposition and NIRDD methods in accordance with the present invention.

In accordance with the present invention, both the NIRDD and UV photodecomposition methods can be used to produce the same final metal oxide films. FIG. 3 depicts the cyclic voltammetry of nickel oxide films produced using both the NIRDD and UV photodecomposition methods of the present invention. Both voltammetry curves depict the same shape and features indicating that the amorphous metal oxide films generated by NIRDD and UV photodecomposition are electrochemically the same.

The following performance metrics were evaluated for the devices formed using metal oxide films prepared using the methods of the present invention: (i) maximum optical modulation (ΔT), the difference of light transmittance between fully colored and bleached states; (ii) switching time for coloring ($t_{c,90\%}$) and bleaching ($t_{b,90\%}$) required to reach 90% of full change of transmittance between the respective fully colored and cleared states; and (iii) coloration efficiency (CE), which corresponds to the change in optical density (Δ(OD)) in response to the change in charge per unit area (ΔQ). The value of CE was acquired by fitting the linear region in the plot of Δ(OD) as a function of ΔQ, and extracting the slope in accordance with Eq. 1 (where $T_b$ and $T_c$ are the transmittance in the bleached state and colored states, respectively, at a given wavelength).

$$CE = \frac{\Delta(OD)}{\Delta Q} = \frac{\log\left(\frac{T_b}{T_c}\right)}{\Delta Q} \quad (Eq. 1)$$

Figure 4:
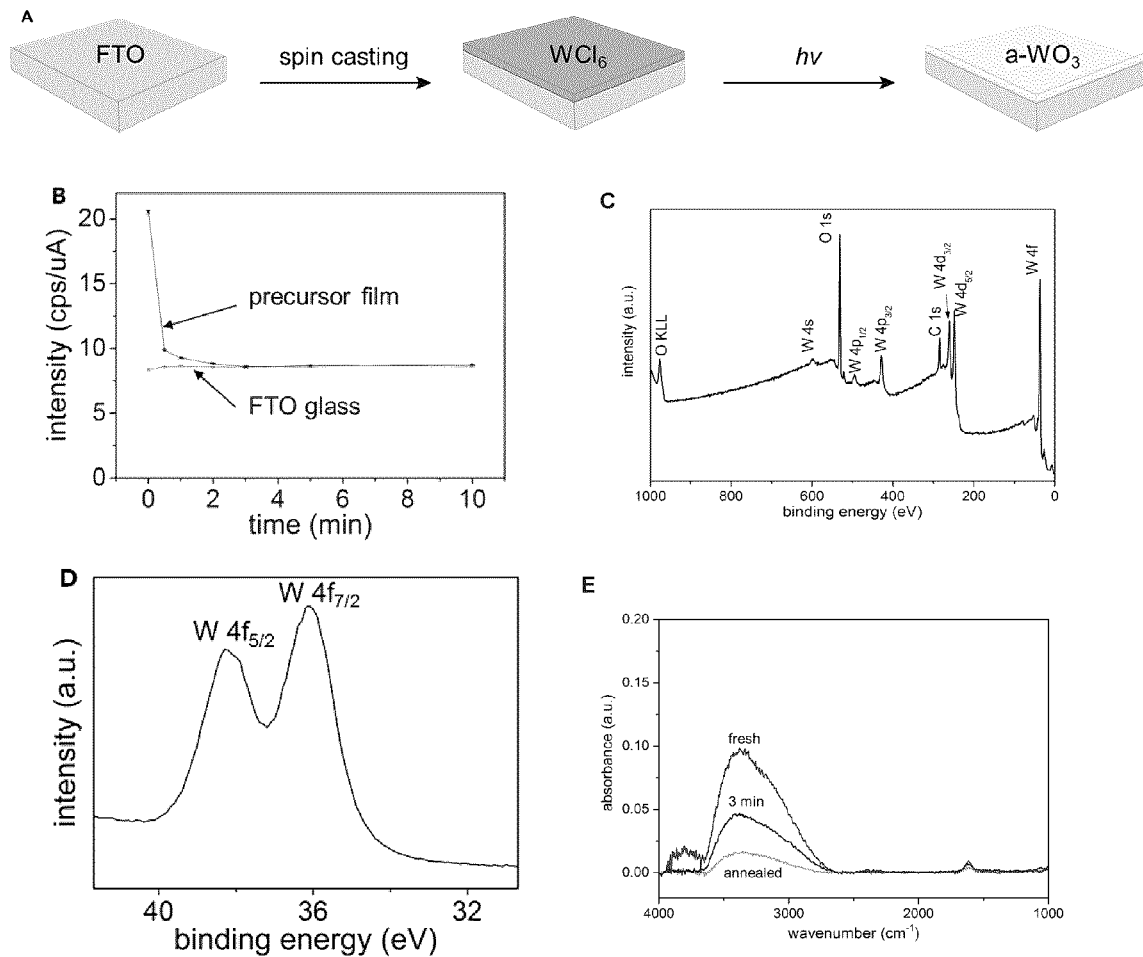
FIG. 4a is a schematic depiction of the formation of the amorphous tungsten oxide films by solution depositing ethanolic solutions of $WCl_6$ on FTO glass followed by UV irradiation in accordance with the present invention.
FIGS. 4b-e depict the result of characterizing an amorphous tungsten oxide films prepared in accordance with the present invention, including (b) XRF analysis to determine chlorine content for $WCl_6$ on FTO glass, (c) and (d) XPS analysis of the metal oxide films on FTO glass, and (e) IR spectra of $WCl_3$ film of FTO glass before photolysis (fresh), after UV irradiation, and after annealing step.

In one embodiment, amorphous tungsten oxide films produced in accordance with the methods of the present invention exhibit electrochromic properties suitable for use in electrochromic devices. FIG. 4a is a schematic depiction of the formation of the amorphous tungsten oxide films by solution depositing ethanolic solutions of $WCl_6$ on FTO glass followed by UV or NIR irradiation in accordance with the methods of the present invention.

Figure 7:
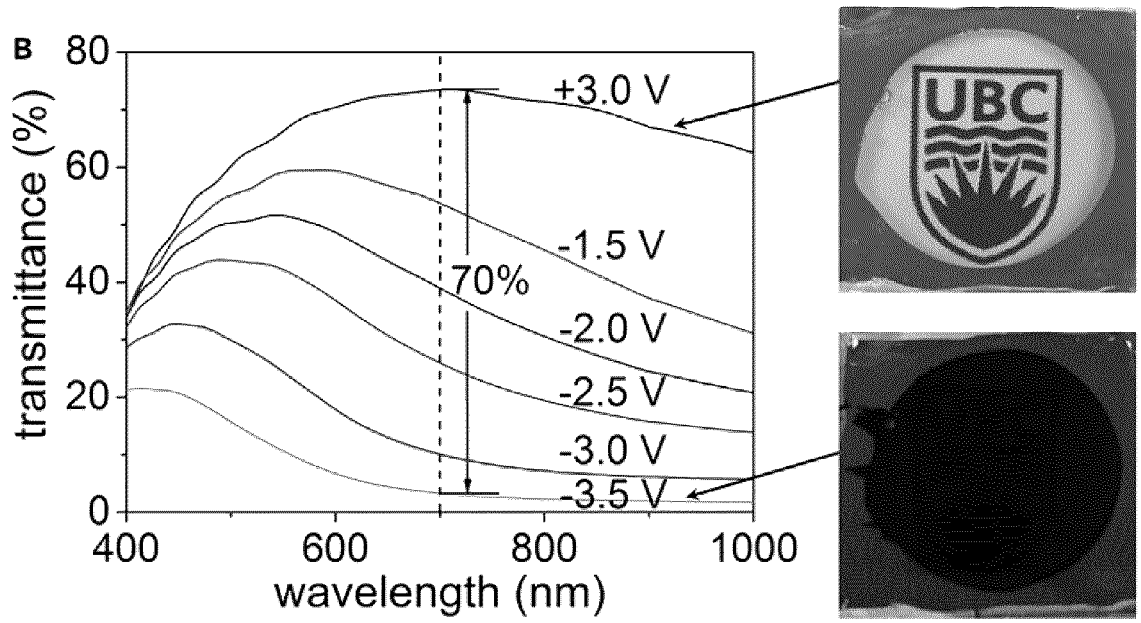
FIG. 7 depicts transmittance data for the bleached and coloured states of a tungsten oxide film prepared in accordance with an embodiment of the present invention.

Amorphous tungsten oxide formed using NIRDD or UV photodecomposition shows broad transmittance in bleached mode (35-75%) and a reduced transmittance in colored mode (5-20%) over the entire visible spectrum as depicted in FIG. 7. The amorphous $WO_3$ films demonstrated voltage-controlled light transmittance over the visible and infrared range (400-1000 nm). The transparency of the tungsten oxide film can be precisely manipulated by controlling the applied bias. Upon introduction of a positive bias the bleached state is generated and transmittance increases. Application of a negative bias generates the coloured state and light transmittance is decreased through the tungsten oxide (FIG. 7).

Figure 9:
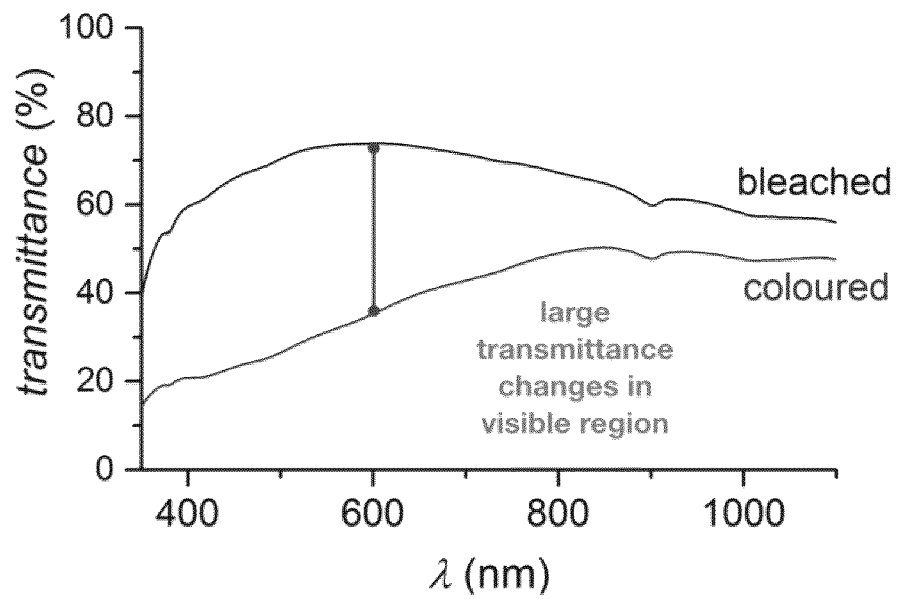
FIG. 9 depicts transmittance data for the bleached and coloured states of nickel oxide prepared in accordance with an embodiment of the present invention.
Figure 10:
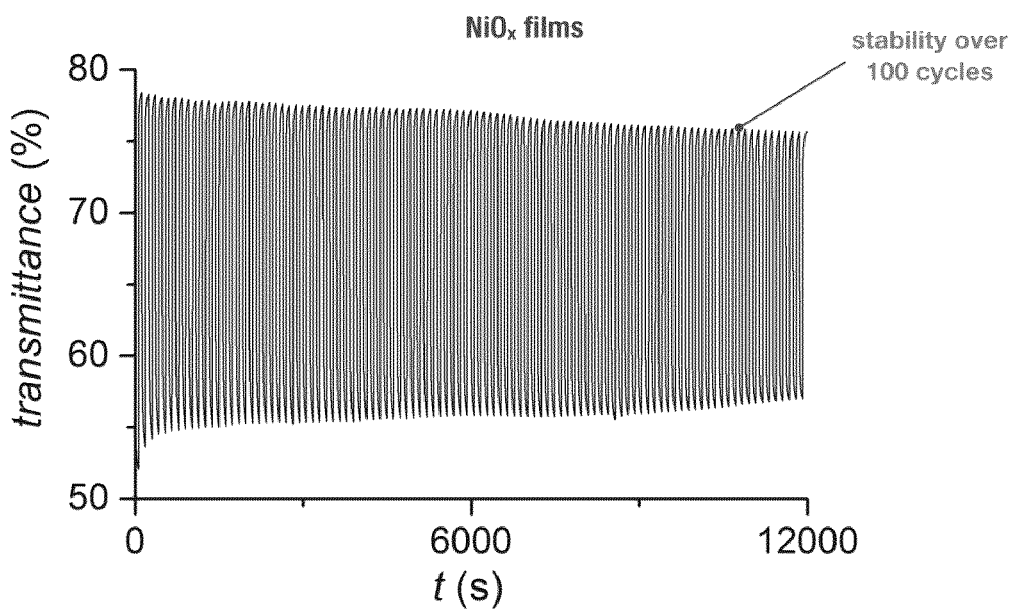
FIG. 10 is a plot depicting voltage cycling and stability over 100 cycles of nickel oxide films prepared in accordance with an embodiment of the present invention.

In one embodiment, amorphous nickel oxide films formed using the NIRDD and UV photodecomposition methods of the present invention also exhibit electrochromic properties suitable for use in electrochromic devices. Upon introduction of a positive bias, the colored state is generated and transmittance decreases. Application of a negative bias generates the bleached state and light transmittance is increased through the nickel oxide. The transparency of the nickel oxide film can be precisely manipulated by controlling the applied bias. A full spectrum transmittance curve for both bleached and colored modes of a nickel oxide film prepared in accordance with the present invention is shown in FIG. 9. Under colored conditions the transmittance ranges from 15-45%, while in bleached mode the transmittance is between 40-70%. Amorphous nickel oxide formed by either the UV photodecomposition or NIRDD methods of the present invention exhibits long-term stability cycling between colored and transparent modes as depicted in FIG. 10. Samples cycled over a time period of 12000 s (100 cycles) repeatedly return to within 5% of their transmittance levels after each individual cycle.

Figure 11:
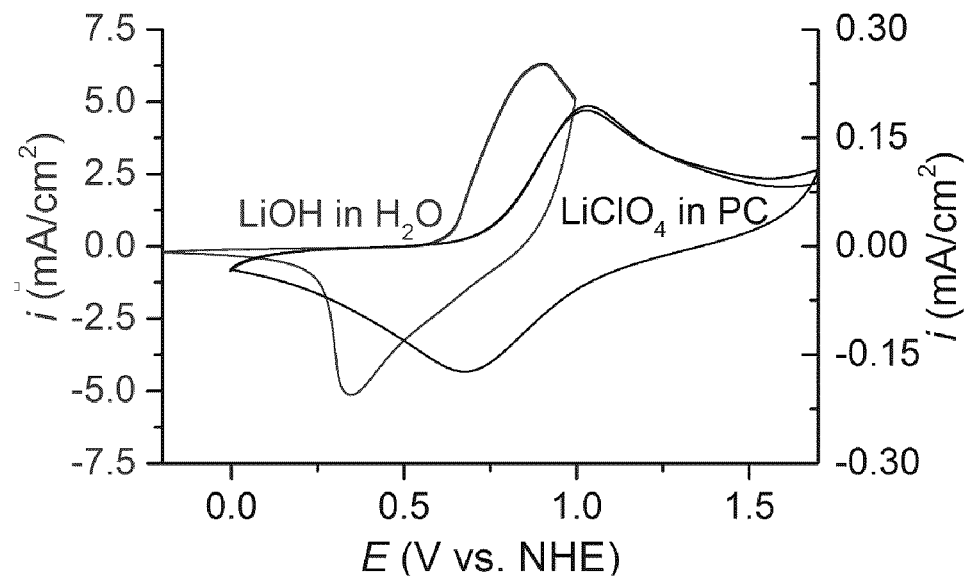
FIG. 11 depicts cycling voltammograms of nickel oxide films prepared in accordance with an embodiment of the present invention over in aqueous ($H_2O$) and non-aqueous solvents (PC—propylene carbonate).

The electrolyte/ion conductor between the anode and cathode materials can be modified to impart desired transparency, conductivity and durability properties. Amorphous nickel oxide films formed using the methods of the present invention provide additional flexibility for electrochromic device design by operating successfully in both aqueous and organic electrolytes. Cyclic voltammetry curves shown in FIG. 11 reveal repeatable, reversible oxidation and reduction peaks in aqueous and non-aqueous solvents demonstrating the stability of the amorphous nickel oxide layer.

Figure 12:
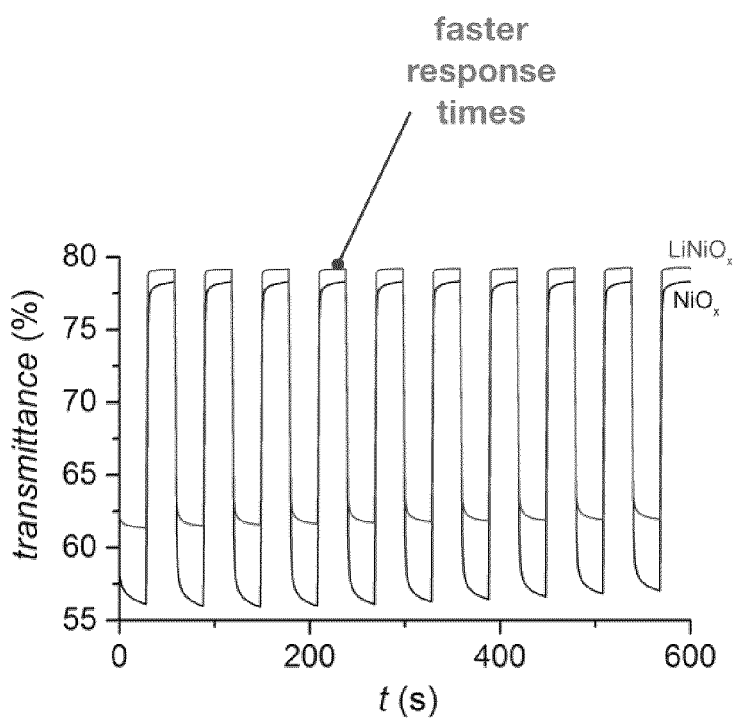
FIG. 12 depicts transmittance data for nickel oxide and lithium nickel oxide films prepared in accordance with an embodiment of the present invention during cycling events.

Mixed metal oxides have been shown in other applications (e.g. superconductors, electrolysis) to achieve superior performance with respect to individual metal oxides. This improvement in performance is achieved through synergistic and energetic effects at the atomic and nanoscale. For the present invention lithium was introduced into the amorphous nickel oxide film in a ratio of 1:3. The mixed metal oxide film $LiNi_3O_x$ achieves steady-state electrochromism much faster (by seconds) than the amorphous nickel oxide as depicted in FIG. 12. Faster steady-state electrochromism is advantageous for commercial applications, especially those requiring rapid transitions of the electrochromic cell from opaque to transparent.

Figure 13:
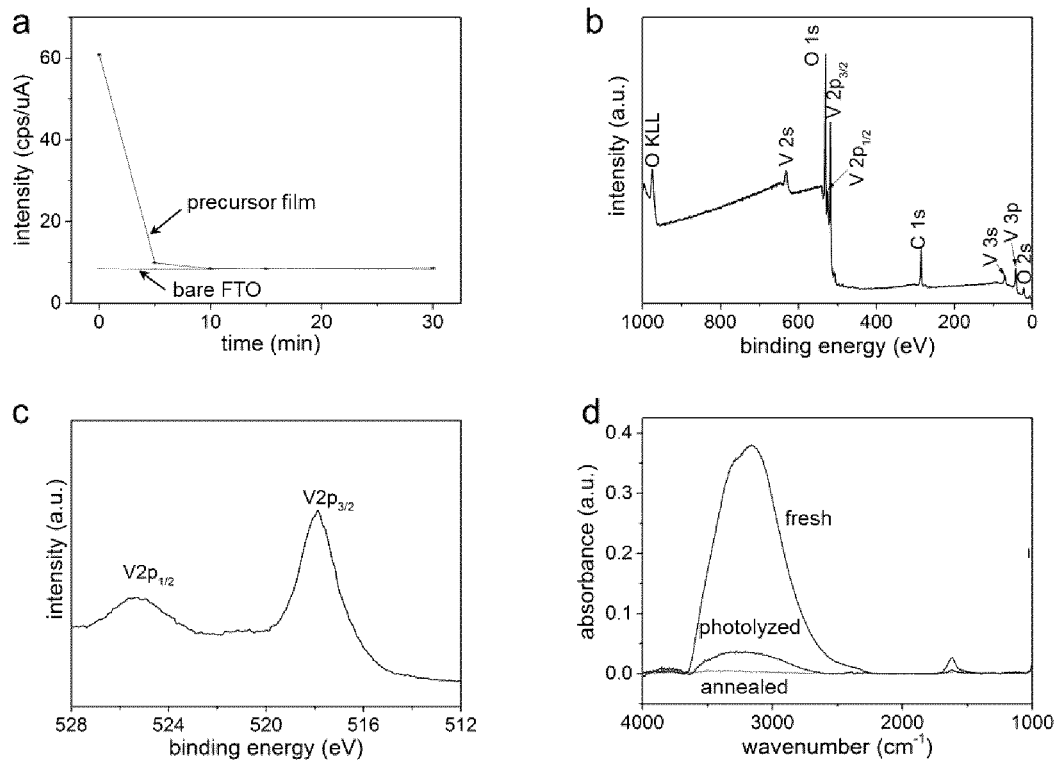
FIG. 13 depicts data relating to the characterization of an amorphous vanadium oxide film prepared in accordance with an embodiment of the present invention, including (a) XRF analysis to determine chlorine content for $VCl_3$ on FTO glass, (b) and (c) XPS analysis of the metal oxide films on FTO glass, and (d) IR spectra of $VCl_3$ film of FTO glass before photolysis (fresh), after UV irradiation, and after annealing step.
Figure 14:
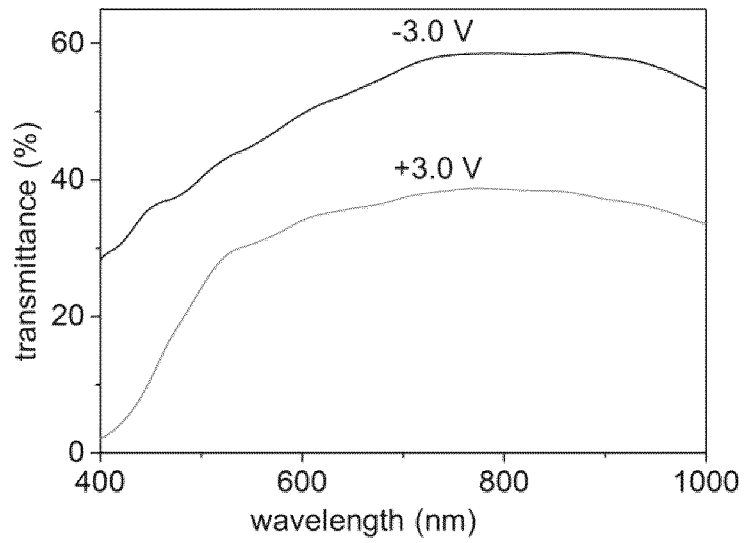
FIG. 14 depicts transmittance data for the bleached and colored states of vanadium oxide film prepared in accordance with an embodiment of the present invention.
Figure 15:
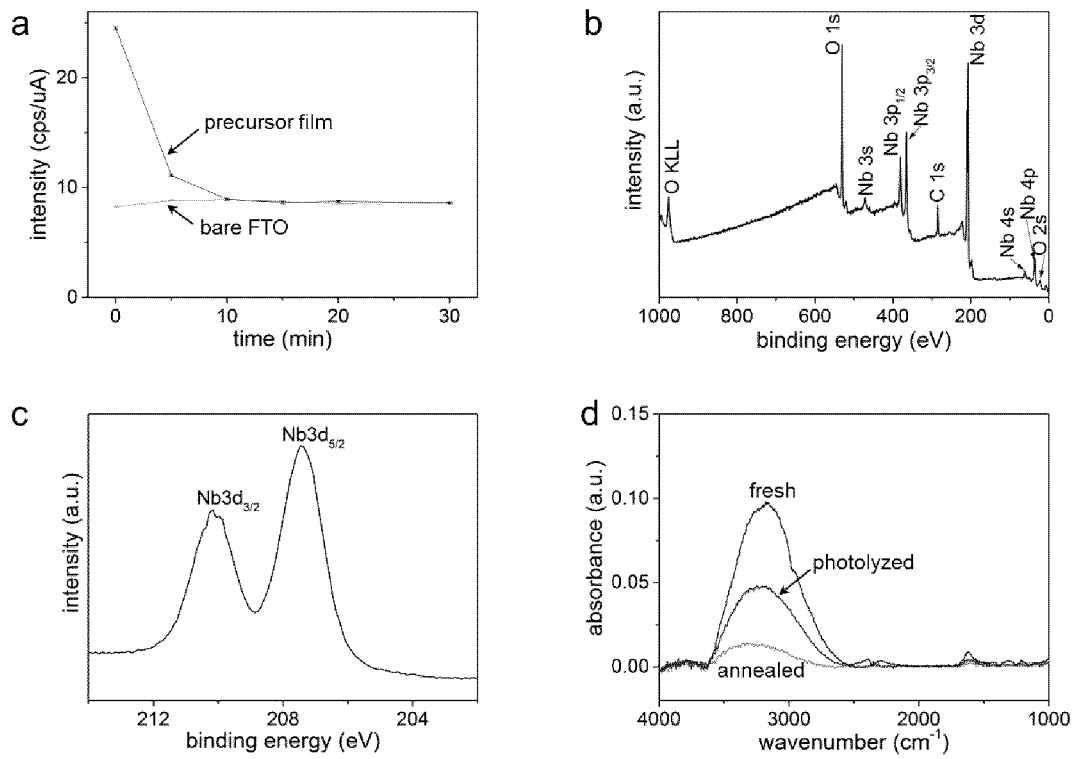
FIG. 15 depicts data relating to the characterization of an amorphous niobium oxide film prepared in accordance with an embodiment of the present invention, including (a) XRF analysis to determine chlorine content for $NbCl_5$ on FTO glass, (b) and (c) XPS analysis of the metal oxide films on FTO glass, and (d) IR spectra of $NbCl_5$ film of FTO glass before photolysis (fresh), after UV irradiation, and after annealing step.
Figure 16:
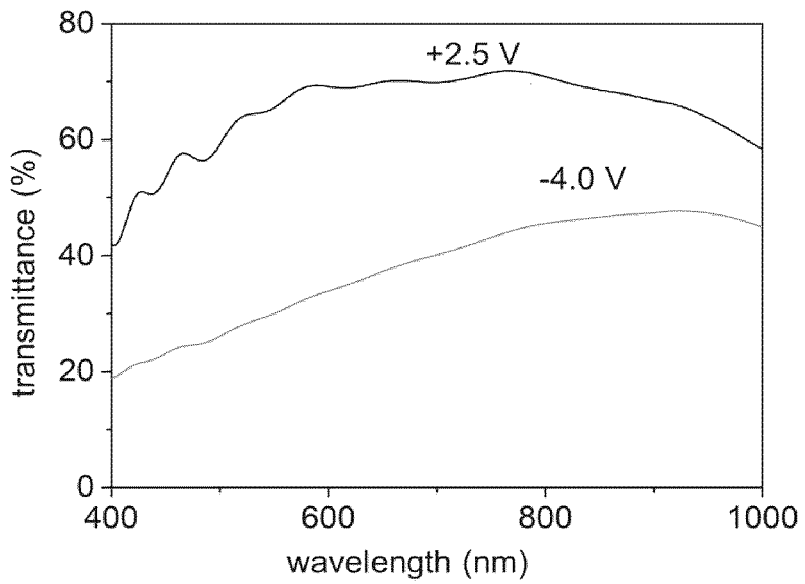
FIG. 16 depicts transmittance data for the bleached and colored states of niobium oxide film prepared in accordance with an embodiment of the present invention.
Figure 17:
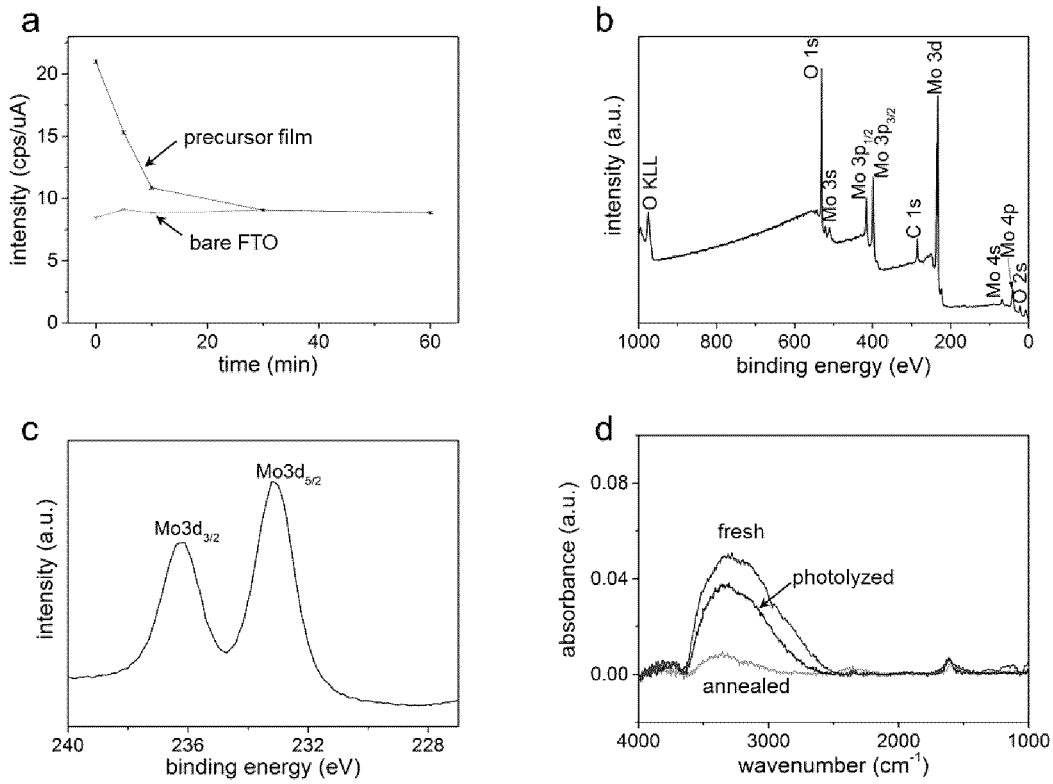
FIG. 17 depicts data relating to the characterization of an amorphous molybdenum oxide film prepared in accordance with an embodiment of the present invention, including (a) XRF analysis to determine chlorine content for $MoCl_5$ on FTO glass, (b) and (c) XPS analysis of the metal oxide films on FTO glass, and (d) IR spectra of $MoCl_5$ film of FTO glass before photolysis (fresh), after UV irradiation, and after annealing step.
Figure 18:
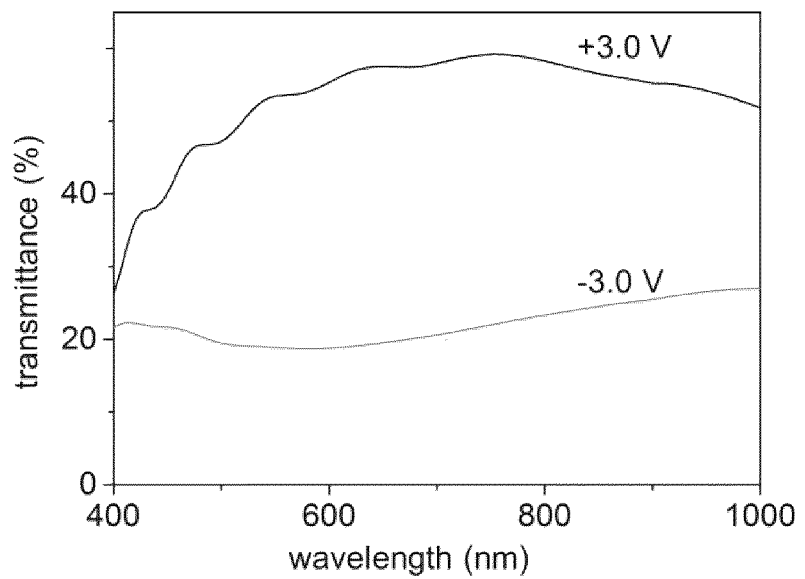
FIG. 18 depicts transmittance data for the bleached and coloured states of molybdenum oxide film prepared in accordance with an embodiment of the present invention.
Figure 20:
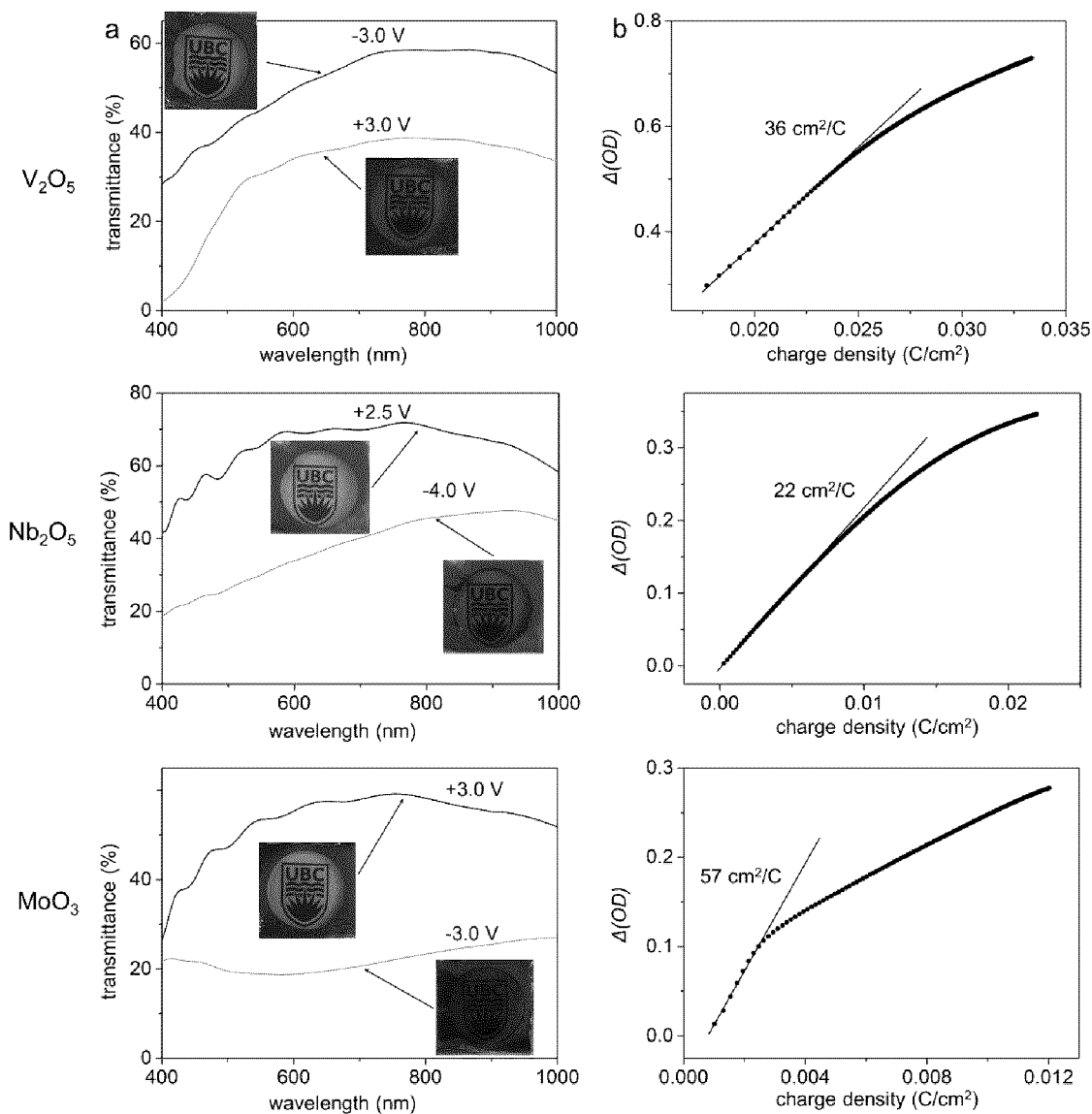
FIG. 20a depicts data relating to the optical transmittance spectra for electrochromic devices containing $V_2O_5$, $Nb_2O_5$, or $MoO_3$ active layers, prepared in accordance with the present invention, (each annealed at 100° C.) in the colored and bleached states formed at the indicated potentials.
FIG. 20b depicts data relating to the change in $\Delta(OD)$ as a function of charge density for electrochromic devices containing $V_2O_5$, $Nb_2O_5$, or $MoO_3$ active layers, prepared in accordance with the present invention.

The generality of the presently methods for making electrochemically active oxide layers was extended to amorphous films of $V_2O_5$, $Nb_2O_5$, and $MoO_3$ derived from $VCl_3$, $NbCl_5$, and $MoCl_5$, respectively. The electrochromic devices containing $V_2O_5$, $Nb_2O_5$, and $MoO_3$ each showed optical modulation in the visible range with at 20%, 30%, and 35%, respectively at wavelengths of 700 nm (FIG. 14, 16, 18, respectively). Larger changes in transmittance were observed at different wavelengths. XPS analyses of each of the as-prepared oxide films confirmed the absence of chlorine and the stabilization of the respective metals (vanadium, niobium, or molybdenum) in their fully oxidized chemical states (FIGS. 13a, 15a and 17a, respectively). The as-prepared $V_2O_5$, $Nb_2O_5$, and $MoO_3$ thin films contained residual water that was effectively removed by further annealing for 1 hour at 100° C. (FIGS. 13d, 15d and 17d, respectively). The electrochromic devices containing $V_2O_5$, $Nb_2O_5$, and $MoO_3$ each showed optical modulation in the visible range with coloration efficiencies of 36, 22, and 57 $cm^2/C$ at wavelengths of 450, 500, and 550 nm, respectively (FIG. 20). FIG. 20a depicts the optical transmittance spectra for electrochromic devices containing three $V_2O_5$, five $Nb_2O_5$, or five $MoO_3$ active layers (each annealed at 100° C.) in the colored and bleached states formed at the indicated potentials. FIG. 20b depicts the plots of Δ(OD) for $V_2O_5$ at 450 nm, $Nb_2O_5$ at 550 nm, and $MoO_3$ at 550 nm as a function of charge density. The CE values obtained by fitting the linear region of each plot are also indicated in FIG. 20b.

FeO films produced by UV decomposition and NIRDD show a strong absorbance in the near-infrared region while remaining transparent to visible light. A FeO film applied to an electrochromic device will block near infrared light regardless of the state of the device, either on or off.

Table 1 compares the CE of various electrochromic metal oxides prepared via different methods. In all cases, the methods described herein provide metal oxide films that are similar, or better than, the films made by other methods.

TABLE 1

Electrochromic performance parameters for cathodic electrochromic films.

| Active layer | Description | Preparation method | CE (cm$^2$/C) | Wavelength[a] (nm) | Ref |
|---|---|---|---|---|---|
| Amorphous WO$_3$ | 600-nm amorphous film | photodeposition | 133 | 700 | this work |
| Crystalline WO$_3$ | 600-nm crystalline film | photodeposition | 69 | 700 | this work |
| WO$_3$ | amorphous film | electrochemical deposition | 62 | 630 | Srivastava et al. (2005) |
| WO$_3$·2H$_2$O | crystalline nanosheets | chemical solution | 121 | 700 | Liang et al. (2013) |
| WO$_3$ | crystalline nanowires | hydrothermal | 103 | 630 | Zhang et al. (2011) |
| WO$_3$ | crystalline mesoporous | chemical condensation | 40 | 630 | Brezesinski et al. (2006) |
| V$_2$O$_5$ | amorphous film | photodeposition | 36 | 450 | this work |
| V$_2$O$_5$ | crystalline | electrochemical deposition | 36 | 430 | Scherer et al. (2012) |
| V$_2$O$_5$ | crystalline nanofibers | electrochemical deposition | 32 | 450 | Tong et al. (2015) |
| Nb$_2$O$_5$ | amorphous | photodeposition | 22 | 500 | this work |
| Nb$_2$O$_5$ | amorphous | chemical condensation | 29 | 500 | Llordes et al. (2016) |
| Nb$_2$O$_5$ | amorphous | thermal condensation | 15 | 500 | Llordes et al. (2016) |
| MoO$_3$ | amorphous | photodeposition | 57 | 550 | this work |
| MoO$_3$ | amorphous | chemical vapor deposition | 26 | 550 | Maruyama et al. (1995) |
| MoO$_3$ | crystalline nanoparticles | sol-gel | 24 | 550 | Hsu et al. (2008) |

[a]Wavelength at which optical data for CE values were recorded.

The methods of the present invention can also be used to deposit a metal oxide film as an ion storage layer on the counter electrode. Ion storage material coated on a TCO substrate can efficiently balance the charges generated by the working electrode (typically WO$_3$) during operation by storing Li-ions during device bleaching and releasing Li-ions that intercalate into the WO$_3$ during colouration. NiO and IrO$_2$ are the commonly used ion storage materials in EC devices, and can improve colouration intensity by providing complementary colouration for the EC devices. However, due to the intrinsic colour of NiO and IrO$_2$, the optical modulation value may be compromised. While is the use of an optically passive ion storage materials such as CeO$_2$ can preserve the transparency of the device in the bleached state, its ion storage capacity is limited. It is therefore highly desirable to seek alternative optically passive counter electrode materials that also demonstrate outstanding ion storage capacity. TiO$_2$ exhibits excellent lithium ion storage capability when used as an anode material in lithium ion batteries, indicating that TiO$_2$ thin films can be used as ion-storage materials for application on the counter electrodes of EC devices.

In one embodiment, an amorphous TiO$_2$ film prepared in accordance with the methods of the present invention is employed as a counter electrode material for use in EC devices.

In one embodiment, an ion storage metal oxide film is coupled to a photodeposited electrochromic film prepared in accordance with the present invention to form a solid state electrochromic device that shows state-of-the art electrochromic performances. Solid-state electrochromic devices can avoid the safety and sealing issues existing in a device using liquid electrolyte.

The invention will now be described with reference to specific examples. It will be understood that the following examples are intended to describe embodiments of the invention and are not intended to limit the invention in any way.

EXAMPLES

Example 1: NiO$_x$ UV Photodecomposition

In this example, fluorine-doped tin oxide (FTO; TEC 7; 7 Ω/sq) substrates are cut into 2.5 by 2.5 cm squares and cleaned with sonication in Extran® 300 detergent for 15 minutes, deionized H$_2$O for 15 minutes, acetone for 15 minutes, exposed to UV light with O$_{3(g)}$ for 20 minutes and spin coated. The precursor solution is a photoactive nickel compound. In this example, nickel (II) 2-ethylhexanoate (78% (w/w) in 2-ethylhexanoic acid, Strem Chemicals) was used. A 0.2 M solution in ethanol was prepared and applied to the clean FTO surface. The sample was spin-coated (3000 rpm, 60 s) to yield a thin film of nickel (II) 2-ethylhexanoate. The coated substrates were then exposed to UV radiation. In this example, the samples were placed under a dual wavelength UV lamp (l=185, 254 nm) for 24 hours. Precursor decomposition was monitored by infrared (IR) spectroscopy and was considered complete when stretches corresponding to the corresponding ligand have disappeared.

Example 2: NiO$_x$ NIRDD

In this example, the same precursors are applied to the same substrates and spin-coated in the same manner as Example 1. In this case, the samples are placed under an infrared lamp to induce precursor decomposition to form an a-NiO$_x$ film. The films formed are transparent following decomposition. The precursor decomposition can be tracked in the same manner as in Example 1.

Example 3: Device Assembly

Films prepared in accordance with the present methods (including those formed in Examples 4 to 15) were incorporated into electrochromic devices fabricated by placing a 2×2 cm square silicone rubber sheet (20 A, thickness=1 mm; McMaster-CARR) with a centered hollow circle (diameter=1.6 cm) on top of a bare FTO glass that serves as the counter electrode. FTO glass was then coated with the electrochromically active metal oxide films (working electrode) laid on top the silicon spacer to form a closed cell. Epoxy glue was used to seal three sides of the cell. A 1-M LiClO$_4$ propylene carbonate electrolyte solution was injected into the cell by a syringe through the unsealed side. Prior to injection, the empty cell and the electrolyte in a vial were purged with dry N$_2$ for 5 min respectively to drive away ambient air. Sealing the fourth side with epoxy glue provided the final electrochromic device. The assembled device had an active area of 2.0 cm$^2$.

Example 4: WO$_3$ UV Photodecomposition

In this example, the transparent conductive oxide was prepared in the same manner as Example 1. Anhydrous ethanol is added to tungsten (VI) chloride (WCl$_6$, Sigma-Aldrich) to make a 0.25 M solution. This solution was stirred for 16 hours and spin-coated onto a substrate (3000 rpm, 60 s) yielding a dark blue film on the substrate. The substrate was then placed under a UV lamp (I=185 or I=185, 254 nm) for decomposition of the precursor to form a-WO$_3$. Transformation to the metal oxide was monitored by X-ray fluorescence. The electrochromic devices were assembled as described in Example 3, with 600-nm films of WO$_3$ films (corresponding to 5 sequential depositions of the tungsten precursor) on FTO glass as the working electrode. The amorphous WO$_3$ films in the devices (denoted as a-WO$_3$) were annealed at 100° C. for 1 hr prior to being placed in the device to suppress delamination from the substrate.

FIG. 4b shows the results of the XRF monitoring of the chlorine content for WCl$_6$ on FTO glass as the chloride precursor decomposes during UV photodecomposition for tungsten, and confirm by XRF analysis complete decomposition of the precursor within 3 min of UV irradiation. FIGS. 4c and 4d show that the XPS analysis of the metal oxide films on FTO glass is consistent with the formulation of WO$_3$ given the presence of W4f spectral signatures consistent with W$^{6+}$. FIG. 4e depicts the IR spectra of WCl$_6$ dissolved in ethanol spin-cast on FTO glass before and after being subjected to UV irradiation for 3 min, as well as the IR spectrum recorded on a layer of WO$_3$ formed after exposure to UV light for 3 min and annealed at 100° C. for 1 hr.

Figure 5:
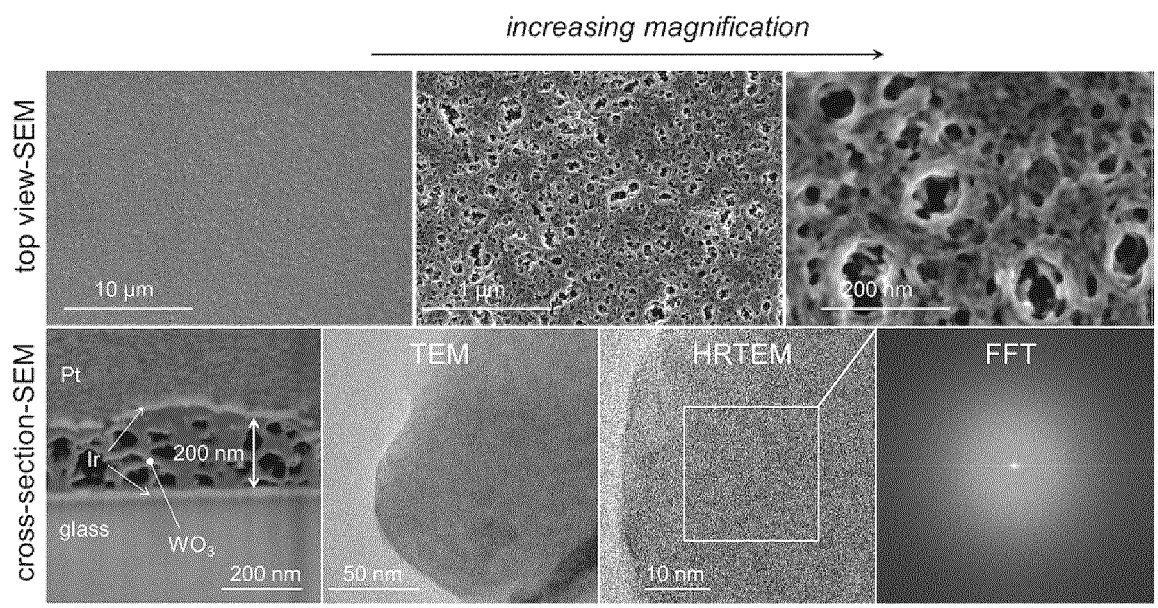
FIG. 5 depicts electron micrographs of a-$WO_3$ films prepared in accordance with an embodiment of the present invention.

FIG. 5 depicts the SEM, TEM, and HRTEM characterization of a single WO$_3$ layer prepared in accordance with the UV irradiation method of the present invention, and annealed for 1 hr at 100° C. The electron micrographs of FIG. 5 show uniform, high-porosity, amorphous films with thicknesses of 200 nm. The iridium and platinum layers shown in the cross-sectional SEM image were deposited to reduce charging effects by increasing film conductivity and to protect the underlying film from the focused ion beam used to create the cross section.

Figure 6:
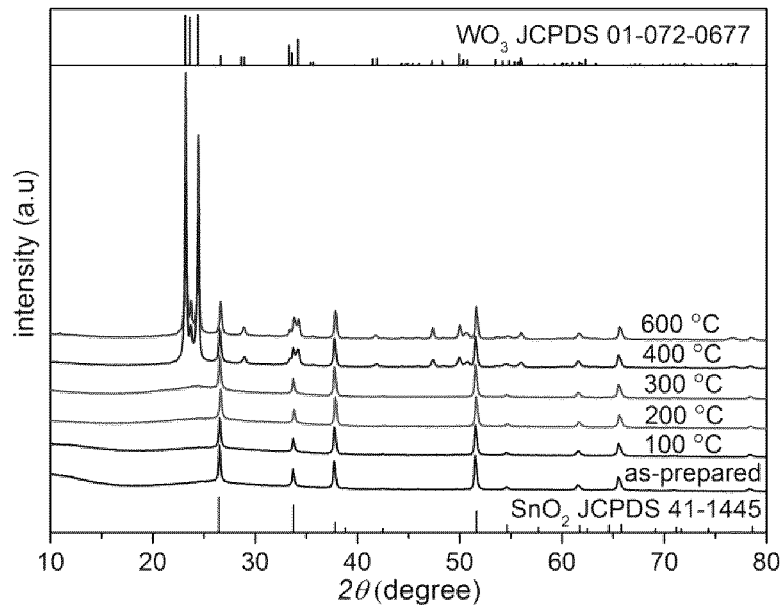
FIG. 6 depicts XRD diffractograms of a thin film of $WO_3$ on FTO glass annealed at progressively higher temperatures up to 600° C., prepared in accordance with an embodiment of the present invention.

The amorphous nature of the WO$_3$ thin films was further supported by XRD diffractograms that show no evidence of crystalline phases other than the FTO substrate (FIG. 6). The films were annealed in 100° C. steps from 100-600° C. for 60 min each. The presence of a crystalline phase, namely monoclinic WO$_3$, was only detected when the films were heated above 400° C. The crystalline WO$_3$ films display electrochromic properties also.

Example 5: Comparison of the Electrochromic Properties of Amorphous and Crystalline WO$_3$ The effects of annealing on amorphous WO$_3$ film produced in Example 4 were investigated. The benchmark crystalline film (denoted as c-WO$_3$) was prepared following the same protocol described in Example 4, but with an additional 1 hr annealing step at 400° C.

Figure 8:
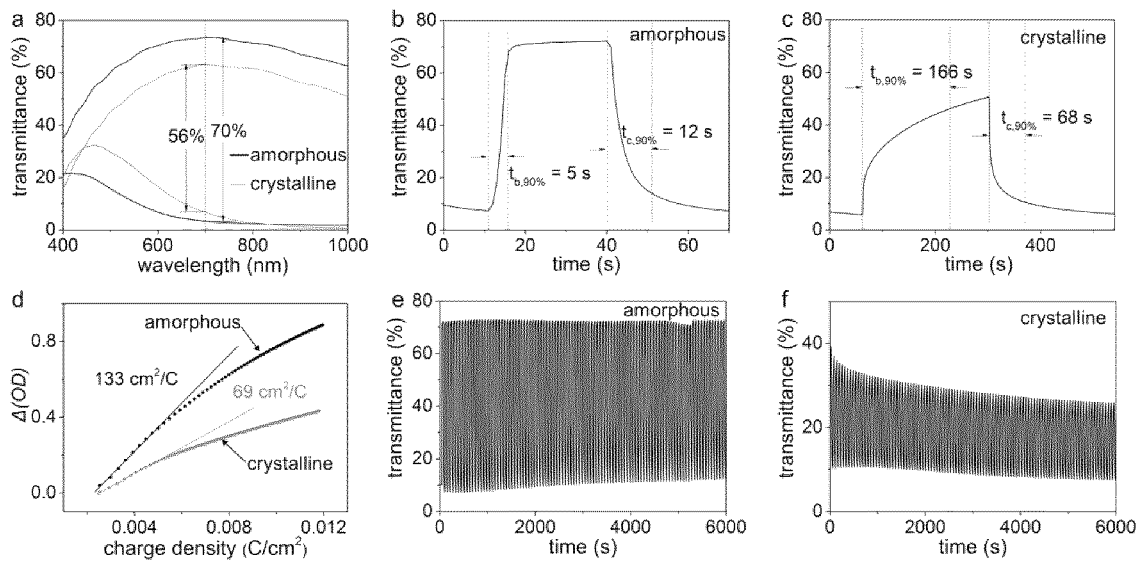
FIG. 8 depicts data relating to the electrochromic properties of amorphous and crystalline $WO_3$ prepared in accordance with an embodiment of the present invention.

Optical transmittance spectra of the devices under coloring and bleaching biases show that the change in transmittance value of ~70% measured at 700 nm for the amorphous WO$_3$ is ~15% higher than the values measured for the crystalline WO$_3$ (FIG. 8a). The transmittance change at 700 nm when the device is switched from colored to bleached back to colored for devices containing amorphous and crystalline films is shown in FIGS. 8b and 8c, respectively. Switching times are indicated. The switching time of coloring (t$_{c,90\%}$, defined by the time required to reach 90% of full change of transmittance from clear to colored state) (12 s) and the switching time of bleaching from colored to clear state (t$_{b,90\%}$) (5 s) values measured for amorphous WO$_3$ (FIG. 8b) were markedly faster than those for crystalline WO$_3$, which show t$_{c,90\%}$ and t$_{b,90\%}$ values that are 5- and 35-fold longer, respectively (FIG. 8c). FIG. 8d depicts changes in optical density (Δ(OD)) at 700 nm as a function of charge density. CE values were determined by fitting the linear region of the plot. The colouration efficiency (CE) of the amorphous WO$_3$ was calculated to be 133 cm$^2$/C at a wavelength of 700 nm, which is almost twice that of crystalline WO$_3$ (FIG. 8d). FIGS. 8e and 8f depict the transmittance change at 700 nm during the electrochromic switching between colored and bleached states for 100 cycles in 30 s steps. The stability of amorphous WO$_3$ (formed by either UV photodecomposition or NIRDD) over 1000 cycles of switching the applied bias from −3.5 V for 30 s to 3.0 V for 30 s confirmed that 90% of the initial transmittance change was retained (FIG. 8e). There is almost negligible degradation in the initial 100 cycles of the amorphous oxide (FIG. 8e), however, the transmittance change for the crystalline tungsten oxide showed significant degradation over the same 100 cycles (FIG. 8f).

Example 6: Effect of Annealing Temperature on Electrochromic Performance

Figure 19:
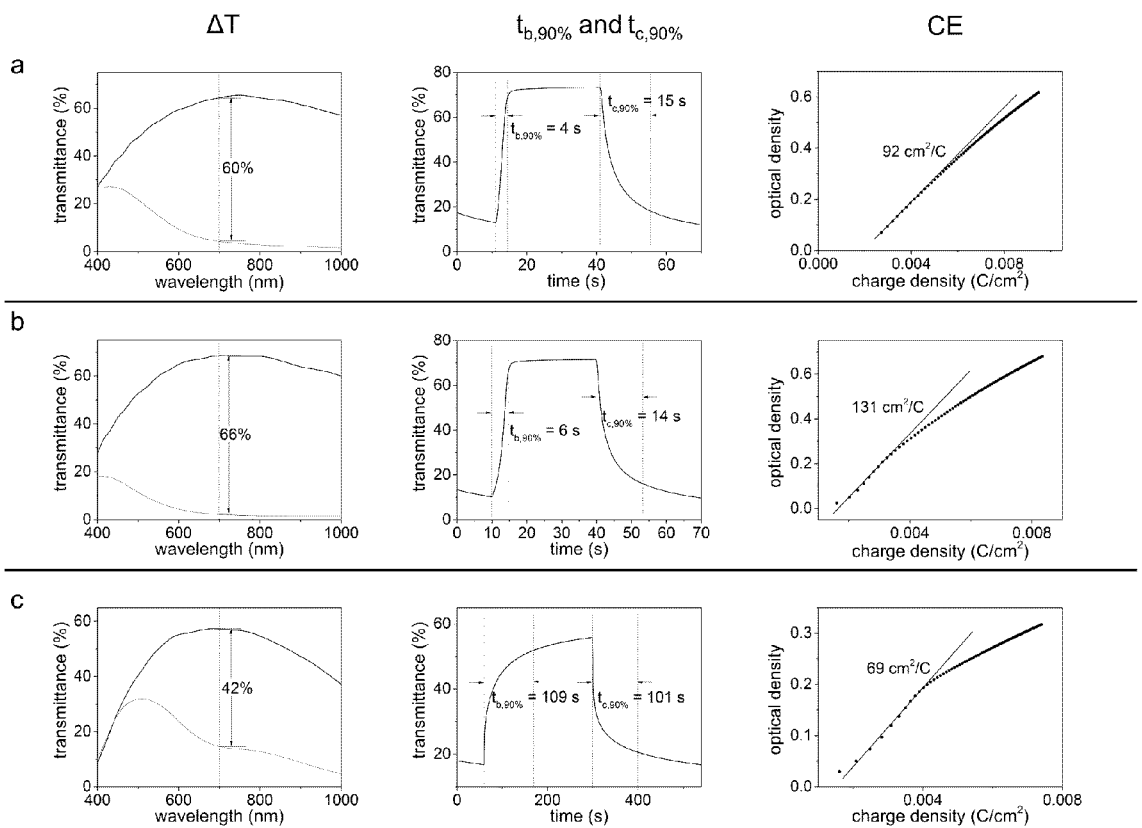
FIG. 19 depicts data relating to the determination of $\Delta T$, $t_{b,90\%}$, and $t_{c,90\%}$ and CE of devices assembled with: (a) as-prepared $WO_3$; (b) $WO_3$ annealed at 200° C. in air for 1 hr; and (c) $WO_3$ annealed at 600° C. in air for 1 hr.

An amorphous WO$_3$ film was prepared in accordance with the method described in Example 4. The as prepared film WO$_3$ was further subjected to an annealing step at 200° C. and an annealing step at 600° C. (Annealing performed in air for 1 hr). The resulting films were characterized and the ΔT, t$_{b,90\%}$, and t$_{c,90\%}$ and CE values of devices assembled are provided in FIG. 19: (a) as-prepared WO$_3$; (b) WO$_3$ annealed at 200° C.; and (c) WO$_3$ annealed at 600° C.

TABLE 2

Performance parameters as a function of annealing temperatures of the active layer for devices assembled with photo-deposited WO$_3$.$^a$

| annealing temperature (° C.) | ΔT (%) | t$_{c,90\%}$ (s) | t$_{b,90\%}$ (s) | CE (cm$^2$/C) |
|---|---|---|---|---|
| as-prepared | 60 | 15 | 4 | 92 |
| 100 | 70 | 12 | 5 | 133 |

TABLE 2-continued

Performance parameters as a function of annealing temperatures of the active layer for devices assembled with photo-deposited $WO_3$.[a]

| annealing temperature (° C.) | ΔT (%) | $t_{c,90\%}$ (s) | $t_{b,90\%}$ (s) | CE (cm²/C) |
|---|---|---|---|---|
| 200 | 66 | 14 | 6 | 131 |
| 400 | 56 | 68 | 166 | 69 |
| 600 | 42 | 101 | 109 | 69 |

Figure 25:
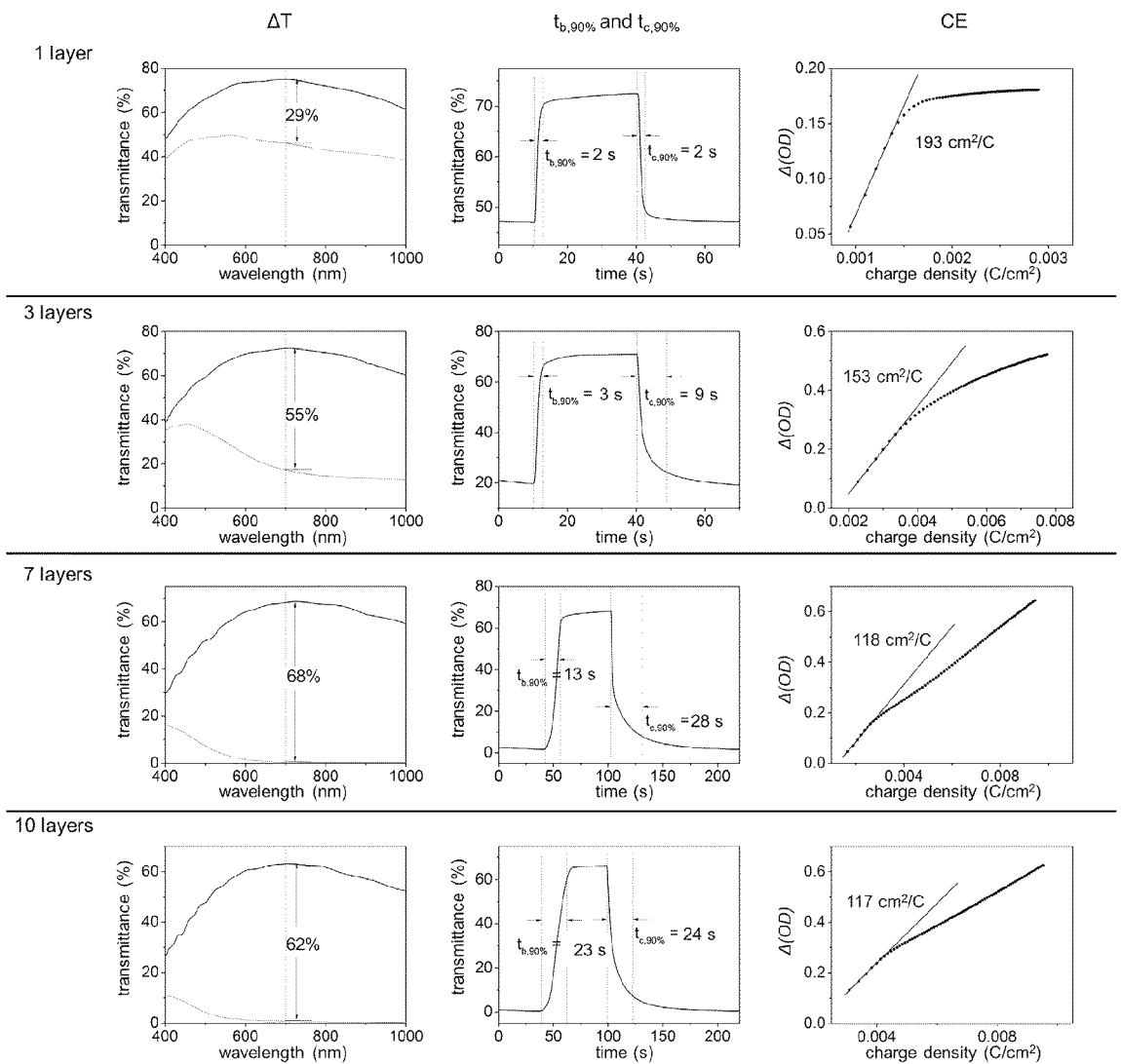
FIG. 25 depicts the results of characterizing $WO_3$ films of difference thicknesses prepared in accordance with the present invention.

[a]Device active layers are ~600 nm (5 successive layers of deposition). Operational potentials for the colored and bleached forms were −3.5 and +3.0 V. Optical data was measured at 700 nm. Values for ΔT, $t_{c,90\%}$, $t_{b,90\%}$ and CE are also shown in FIG. 25.

Example 7: Effect of $WO_3$ Film Thickness on Electrochromic Performance

The electrochromic performance of a-$WO_3$ at different thicknesses was evaluated to determine how performance is affected by film thickness by successively adding up to 10 layers of films (Table 3). The ΔT values at 700 nm increases from 29% to 70% from 1-5 layers, respectively. Although additional layers led to darker coloration, they did not benefit the optical modulation, which was reduced to 62% with 10 layers, because of the compromised transparency of the thicker layers. Moreover, switching times and CE values were both found to be inversely proportional to film thickness. The coloring and bleaching times of 2 s observed for one layer increased to >20 s for 10 layers, while a coloration efficiency of 193 cm²/C decreased to 117 cm²/C with 10 layers.

TABLE 3

Performance parameters as a function of active layer thickness for devices assembled with photo-deposited $WO_3$ annealed at 100° C. for 1 hr.[a]

| # layers[b] | ΔT (%) | $t_{c,90\%}$ (s) | $t_{b,90\%}$ (s) | CE (cm²/C) |
|---|---|---|---|---|
| 1 | 29 | 2 | 2 | 193 |
| 3 | 55 | 9 | 3 | 153 |
| 5 | 70 | 12 | 5 | 133 |
| 7 | 68 | 28 | 13 | 118 |
| 10 | 62 | 24 | 23 | 117 |

[a]Colored and bleached states produced at −3.5 and +3.0 V, respectively. Optical data measured at 700 nm. Values for ΔT, $t_{c,90\%}$, $t_{b,90\%}$ and CE are also shown in FIG. 25.
[b]SEM cross-sectional imaging verified film thicknesses of 200 and 600 nm for 1 and 5 layers, respectively.

Example 8: $WO_3$ NIRDD

In this example, the transparent conductive oxide is prepared in the same manner as Example 1. Anhydrous ethanol is added to tungsten (VI) chloride ($WCl_6$, Sigma-Aldrich) to make a 0.25 M solution. This solution is stirred for 16 hours and spin-coated onto a substrate (3000 rpm, 60 s) yielding a dark blue film on the substrate. The substrate is then placed under an IR lamp for decomposition of the precursor to form a-$WO_3$, and transformation to the metal oxide is monitored by X-ray fluorescence. The amorphous or crystalline phase can be obtained through annealing after the conversion to the oxide. The electrochromic devices were assembled as described in Example 3.

Example 9: $LiNiO_x$ and Other Mixed Metal Compositions by UV Photodecomposition or NIRDD In this example, the transparent conductive oxide was prepared in the same manner as Example 1. A 0.2 M solution of nickel (II) 2-ethylhexanoate (78% (w/w) in 2-ethylhexanoic acid, Strem Chemicals) and lithium 2-ethylhexanoate (Strem Chemicals) was prepared in hexanes with varying ratios of Li:Ni, for example 25:75, 40:60, 50:50, 75:25. The solution is applied to the TCO substrate and spin-coated onto a substrate (3000 rpm, 60 s). The precursors are decomposed under either a UV lamp (I=185 or I=185, 254 nm) or an IR lamp to form a-$LiNiO_x$.

Transformation to the metal oxide was monitored as in Example 1. The electrochromic devices were assembled as described in Example 3.

Example 10: $V_2O_5$ UV Photodecomposition

In this example, the transparent conductive oxide was prepared in the same manner as Example 1. Anhydrous ethanol was added to vanadium (III) chloride ($VCl_3$, Sigma-Aldrich) to make a 0.25 M solution. This solution was stirred for 16 hours and spin-coated onto a substrate (3000 rpm, 60 s) yielding a dark blue film on the substrate. The substrate was then placed under a UV lamp (I=185 or I=185, 254 nm) for decomposition of the precursor to form a-$V_2O_5$. Transformation to the metal oxide was monitored as in Example 4.

FIG. 13a depicts a plot of the chlorine content for vanadium chloride precursor film on FTO glass as a function of irradiation time, as measured by XRF analysis, and confirmed complete decomposition of the precursor after 10 min of irradiation. FIGS. 13b and 13c show that the XPS analysis of the metal oxide films on FTO glass is consistent with the formulation of as-prepared $V_2O_5$ on FTO glass. FIG. 13c is an expanded XPS spectrum featuring $V2p_{1/2}$ and $V2p_{3/2}$ signals at 525.40 eV and 517.85 eV, respectively, that are diagnostic of $V^{5+}$. FIG. 13d is an IR spectra of an ethanolic solution of $VCl_5$ spin-cast on FTO glass before (fresh) and after (photolyzed) being subjected to UV irradiation for 10 min. The as-prepared oxide film annealed at 100° C. for 1 hr is also indicated (annealed) in FIG. 13d.

Example 11: $V_2O_5$ NIRDD

In this example, the transparent conductive oxide is prepared in the same manner as Example 1. Anhydrous ethanol is added to vanadium (III) chloride ($VCl_3$, Sigma-Aldrich) to make a 0.25 M solution. This solution is stirred for 16 hours and spin-coated onto a substrate (3000 rpm, 60 s) yielding a dark blue film on the substrate. The substrate is then placed under an IR lamp for decomposition of the precursor to form a-$V_2O_5$, and transformation to the metal oxide is monitored by X-ray fluorescence. The amorphous or crystalline phase can be obtained through annealing after the conversion to the oxide. The electrochromic devices were assembled as described in Example 3.

Example 12: $Nb_2O_5$ UV Photodecomposition

In this example, the transparent conductive oxide was prepared in the same manner as Example 1. Anhydrous ethanol was added to niobium (V) chloride ($NbCl_5$, Sigma-Aldrich) to make a 0.25 M solution. This solution was stirred for 16 hours and spin-coated onto a substrate (3000 rpm, 60 s) yielding a dark blue film on the substrate. The substrate was then placed under either a UV lamp (I=185 or I=185, 254 nm) for decomposition of the precursor to form a-$Nb_2O_3$. Transformation to the metal oxide was monitored as in Example 4. The electrochromic devices were assembled as described in Example 3.

FIG. 15a depicts a plot of the chlorine content for niobium chloride precursor film on FTO glass as a function of irradiation time, as measured by XRF analysis, and confirmed complete decomposition of the precursor after 10 min of irradiation. FIGS. 15b and 15c show that the XPS analysis of the metal oxide films on FTO glass is consistent with the formulation of as-prepared $Nb_2O_5$ on FTO glass. FIG. 15c is an expanded XPS spectrum featuring $Nb3d_{3/2}$ and $Nb3d_{5/2}$ signals at 210.10 eV and 207.40 eV, respectively, that are diagnostic of $Nb^{5+}$. FIG. 15d is an IR spectra of an ethanolic solution of $NbCl_5$ spin-cast on FTO glass before (fresh) and after (photolyzed) being subjected to UV irradiation for 10 min. The as-prepared oxide film annealed at 100° C. for 1 h is also indicated (annealed) in FIG. 15d.

Example 13: $Nb_2O_5$ NIRDD

In this example, the transparent conductive oxide is prepared in the same manner as Example 1. Anhydrous ethanol is added to niobium (V) chloride ($NbCl_5$, Sigma-Aldrich) to make a 0.25 M solution. This solution is stirred for 16 hours and spin-coated onto a substrate (3000 rpm, 60 s) yielding a dark blue film on the substrate. The substrate is then placed under an IR lamp for decomposition of the precursor to form $a-Nb_2O_3$, and transformation to the metal oxide is monitored by X-ray fluorescence. The amorphous or crystalline phase can be obtained through annealing after the conversion to the oxide. The electrochromic devices were assembled as described in Example 3.

Example 14: $MoO_3$ UV Photodecomposition

In this example, the transparent conductive oxide was prepared in the same manner as Example 1. Anhydrous ethanol was added to molybdenum (V) chloride ($MoCl_5$, Sigma-Aldrich) to make a 0.25 M solution. This solution was stirred for 16 hours and spin-coated onto a substrate (3000 rpm, 60 s) yielding a dark blue film on the substrate. The substrate was then placed under either a UV lamp (I=185 or I=185, 254 nm) or an IR lamp for decomposition of the precursor to form $a-MoO_3$. Transformation to the metal oxide was monitored as in Example 4. The electrochromic devices were assembled as described in Example 3.

FIG. 17a depicts a plot of the chlorine content for molybdenum chloride precursor film on FTO glass as a function of irradiation time, as measured by XRF analysis, and confirmed complete decomposition of the precursor after 30 min of irradiation. FIGS. 17b and 17c show that the XPS analysis of the metal oxide films on FTO glass is consistent with the formulation of as-prepared $MoO_3$ on FTO glass. FIG. 17c is an expanded XPS spectrum featuring $Mo3d_{3/2}$ and $Mo3d_{5/2}$ signals at 236.28 eV and 233.15 eV, respectively, that are diagnostic of $Mo^{6+}$. FIG. 17d is an IR spectra of an ethanolic solution of $MoCl_5$ spin-cast on FTO glass before (fresh) and after (photolyzed) being subjected to UV irradiation for 30 min. The as-prepared oxide film annealed at 100° C. for 1 h is also indicated (annealed) in FIG. 17d.

Example 15: $MoO_3$ NIRDD

In this example, the transparent conductive oxide is prepared in the same manner as Example 1. Anhydrous ethanol is added to molybdenum (V) chloride ($MoCl_5$, Sigma-Aldrich) to make a 0.25 M solution. This solution is stirred for 16 hours and spin-coated onto a substrate (3000 rpm, 60 s) yielding a dark blue film on the substrate. The substrate is then placed under an IR lamp for decomposition of the precursor to form $a-MoO_3$, and transformation to the metal oxide is monitored by X-ray fluorescence. The amorphous or crystalline phase can be obtained through annealing after the conversion to the oxide. The electrochromic devices were assembled as described in Example 3.

Example 16: Use of Amorphous $TiO_2$ as an Ion Storage Material in an EC Device

Amorphous $TiO_2$ films were produced using the solution-based photodeposition methods of the present invention. To form the $TiO_2$ film, 155 mg Ti(IV) 2-ethylhexanoate were dissolved in 1 mL HPLC-grade isopropanol yielding a 0.25 M solution. This solution was pipetted onto a FTO-coated glass substrate and spun cast at 3000 rotations per minute for 1 minute (Laurell model WS-650MZ-23NPP-Lite). The resultant precursor films were subjected to 10 minutes of UV (Atlantic Ultraviolet G18T5VH/U; Imax=185) irradiation. The films were annealed in an oven (Ney Vulcan 3-550) in air at different temperatures for 1 h with a ramping rate of 10° C./min. The $WO_3$ films were produced by the same procedures except that 0.22 M $WCl_6$ isopropanol solution were used as the precursor solution and UV irradiation time was 5 min.

The resulting amorphous $TiO_2$ film can be crystallized to anatase $TiO_2$ (JCPDS 021-1272) at 400° C. The crystalline $TiO_2$ film displays an almost identical morphology to amorphous films, with a thickness of about 60 nm, slightly thinner than amorphous films.

Figure 24:
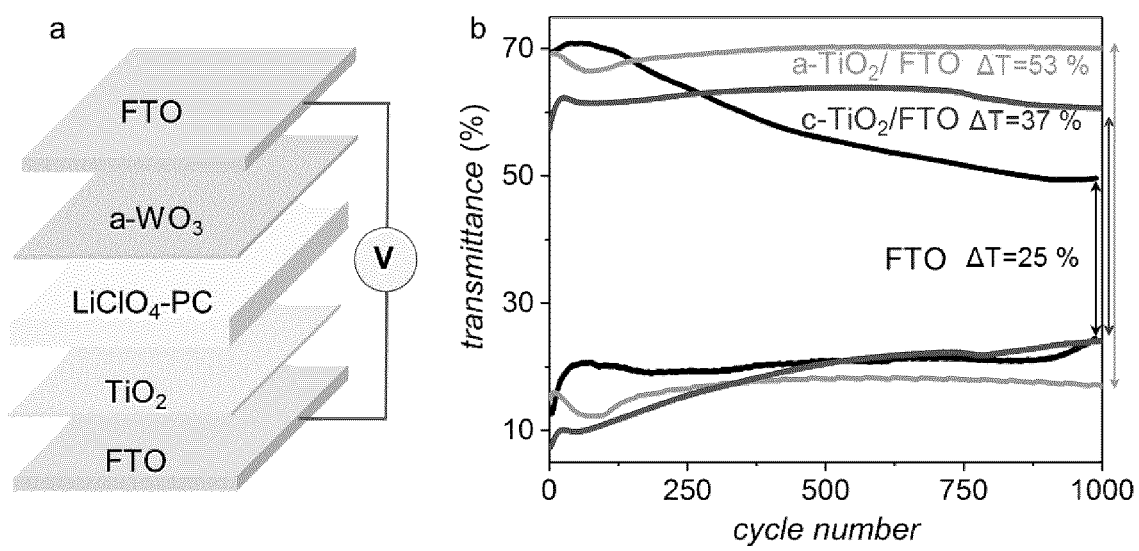
FIG. 24a is a schematic depiction of a device employing a $TiO_2$ film on the FTO glass counter electrode as an ion storage material, prepared in accordance with an embodiment of the present invention.
FIG. 24b depict the results of characterizing and comparing EC devices employing a $TiO_2$ film on the FTO glass counter electrode as an ion storage material, including (b) maximum and minimum transmittance at wavelength of 700 nm over 1000 cycles for EC devices with $WO_3$ as the electrochromic layer, and a-$TiO_2$ (light grey) or crystalline c-$TiO_2$ (dark grey) deposited on FTO as the counter electrode, or without a TiOx film.

FIG. 24a is a schematic depiction of an EC device employing $TiO_2$ as an ion storage material and $WO_3$ as the electrochromic layer. The EC device was assembled using the same method described in Example 3.

FIG. 24b depicts the maximum and minimum transmittance at wavelength of 700 nm over 1000 cycles for EC devices with $WO_3$ as the electrochromic layer, $a-TiO_2$ (light grey) and crystalline $c-TiO_2$ (dark grey) deposited on FTO as the counter electrode, to be further compared to bare FTO (black). For each cycle, the device was coloured at −3.5 V for 30 s and subsequently bleached at +3.0 V for another 30 s. As shown in FIG. 24b, the EC device with a $TiO_2$ coating as the counter electrode showed enhanced cycling stability compared to a device using bare FTO. This may be due a protective effect provided by the thin layer of $TiO_2$ film on FTO, which protect the crystalline FTO substrate from degradation, as shown by the retention of low internal resistance of the device using $a-TiO_2$ at the counter electrode after cycling 1000 times (Table 4).

TABLE 4

Internal resistance[a] across the electrodes of the EC device before and after cycling for devices with FTO and $a-TiO_2$ on FTO as the counter electrode

| Counter electrode | Resistance before cycling (Ω) | Resistance after 1000 cycles (Ω) |
|---|---|---|
| FTO | 35 | 378 |
| $a-TiO_2$ on FTO | 32 | 33 |

[a]The resistance was measured by iR compensation

Example 17: Preparation of a Solid State Electrochromic Device

The $WO_3$ and $NiO_x$ films were synthesized by slight modification of the previously reported method.

To prepare the $WO_3$ film for use in the solid state EC device, a precursor solution prepared by dissolving 0.4 g $WCl_6$ in 4 ml 2-propanol (0.25 M) was spin-coated on FTO glass at 3000 rpm for 60 s (Laurell model WS-650MZ-23NPP-Lite). The resultant precursor thin films were subjected to UV (Atlantic Ultraviolet G18T5VH/U; $\lambda_{max}$=185) irradiation until complete decomposition was confirmed by monitoring the chlorine content using XRF analysis.

Figure 21:
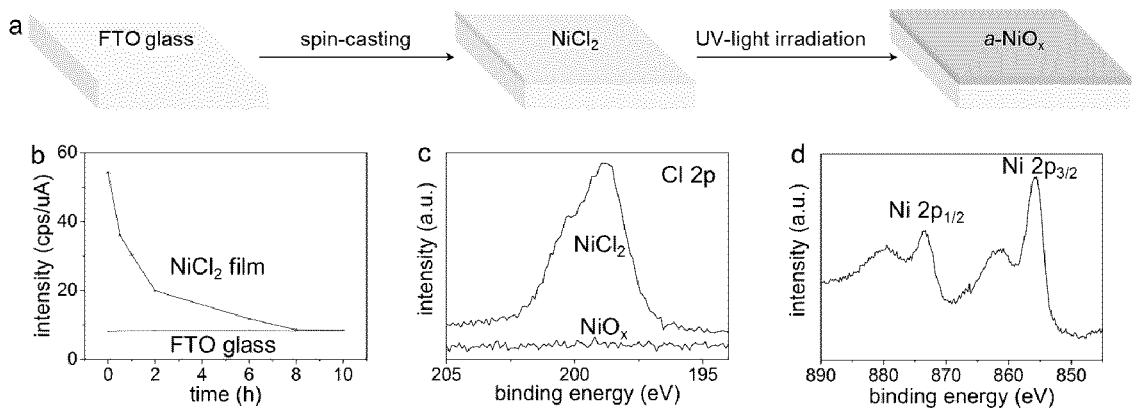
FIG. 21a is a schematic depiction of the formation of the amorphous nickel oxide films by solution depositing ethanolic solutions of $NiCl_2$ on FTO glass followed by UV irradiation in accordance with the present invention.
FIGS. 21b-d depicts the results of characterizing the $NiO_x$ films prepared in accordance with the present invention, including (b) XRF analysis to determine chlorine content as a function of time, (c) and (d) XPS analysis of the metal oxide film on FTO glass.

To prepare the $NiO_x$ film for use as an ion storage material in the solid state EC device, a $NiCl_2$ aqueous solution (0.25 M) was used as precursor solution and the remaining procedures remain the same as for the preparation of the $WO_3$ film. FIG. 21a is a schematic illustration showing UV light irradiation of spin-casted $NiCl_2$ precursor films on FTO glass lead to formation of amorphous $NiO_x$ (a-$NiO_x$).

Analysis of the resulting a-$NiO_x$ film is depicted in FIGS. 21b to 21d. FIG. 21b depicts a plot of the chlorine of Cl in precursor film determined by XRF analyzer as a function of UV irradiation time, and confirm that chloride ions are completely removed by UV light in 8 hours. FIG. 21c is an XPS spectra of $NiCl_2$ precursor and as-formed $NiO_x$ in binding energy range corresponding to Cl 2p. No Cl 2p signal appears in as-formed $NiO_x$, confirming fully decomposition of chloride ions in by UV irradiation. FIG. 21d is an XPS spectrum of $NiO_x$ in the binding energy range corresponding to Ni 2p, matching well with that of $Ni^{2+}$.

To prepare the electrolyte for use in the solid state device, $LiClO_4$ and PMMA were dried in an oven at 100° C. for overnight. Propylene carbonate (PC) was dried overnight by adding Molecular Sieve Type-3A with a w/v of 20%. The molecular sieves were activated before use by annealing at 300° C. for overnight. 0.532 g $LiClO_4$ was dissolved in 10 ml propylene carbonate to form a 0.5 M solution. 1.339 g PMMA was then added to the $LiClO_4$—PC solution under magnetic stirring. The mixtures were stirred and heated at 60° C. on a hot plate for overnight to form a transparent colorless gel electrolyte.

Prior to assembly of the device, prelithiation of $NiO_x$ films was carried out in a 1 M-$LiClO_4$ propylene carbonate electrolyte using a conventional three electrode system with $NiO_x$ films on FTO glass as working electrode, Ag/AgCl as reference electrode, and Pt wire as counter electrode. The lithium ions were injected into $NiO_x$ by applying a potential of −1.5 V (vs Ag/AgCl) for 10 min. Electrochromic devices were fabricated by placing a 2×2 cm square silicone rubber sheet (50 A, thickness=1 mm; McMaster-CARR) with a centered hollow circle (diameter=1.6 cm) on top of prelithiated $NiO_x$ film on FTO glass that serves as the counter electrode. A gel electrolyte of LiClO4-PC-PMMA was then drop-casted into the hollow circle. FTO glass was then coated with the $WO_3$ films (working electrode) laid on top the silicon spacer to form a closed cell. Epoxy glue was used to seal the cell. The assembled device had an active area of 2.0 cm². The assembled devices were heated at 60° C. in an oven for overnight before property characterization.

Figure 22:
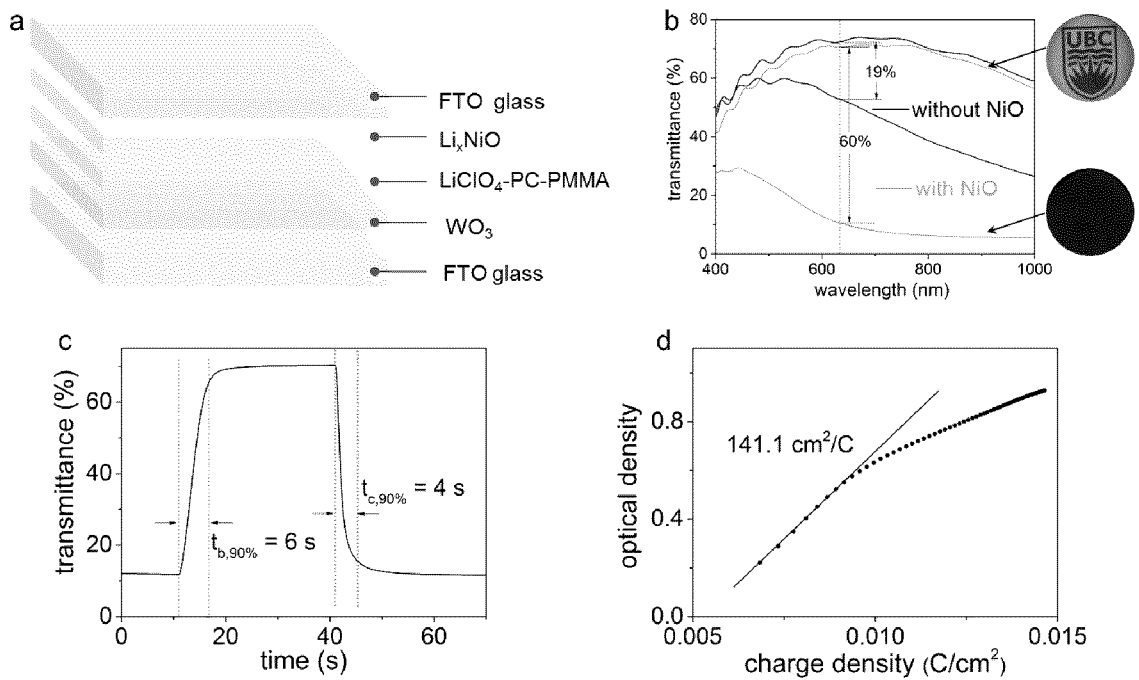
FIG. 22a is a schematic depiction of the architecture of a solid state EC device using an $NiO_x$ film on the FTO glass counter electrode as an ion storage material, prepared in accordance with an embodiment of the present invention.
FIGS. 22b-d depict the results of characterizing solid state devices employing an NiOx film on the counter electrode prepared in accordance with an embodiment of the present invention, including (b) a comparison of the transmittance spectra obtained for EC devices prepared with and without a-$NiO_x$ on the FTO glass counter electrode, (c) the transmittance change for the EC device prepared with a-$NiO_x$ on FTO as counter electrode as a function of time, and (d) changes in optical density at 633 nm as a function of charge density for a solid state EC device prepared using a-$NiO_x$ on the FTO glass counter electrode.

FIG. 22a is a schematic depiction of the architecture of a solid state EC device using an $NiO_x$ film on the FTO glass counter electrode as an ion storage material.

FIG. 22b shows a comparison of the transmittance spectra obtained for EC devices prepared with and without a-$NiO_x$ on the FTO glass counter electrode at bleached and colored state. The spectra were recorded after coloring at −2.1 V or bleaching at +2.1 V for 60 s.

FIG. 22c shows the transmittance change at wavelength of 633 nm for the EC device prepared with a-$NiO_x$ on FTO as counter electrode as a function of time. The device was bleached at +2.1 V for 30 s, then colored at −2.4 V for another 30 s. Switch times are indicated.

FIG. 22d shows changes in optical density at 633 nm as a function of charge density for a solid state EC device prepared using a-$NiO_x$ on the FTO glass counter electrode.

Figure 23:
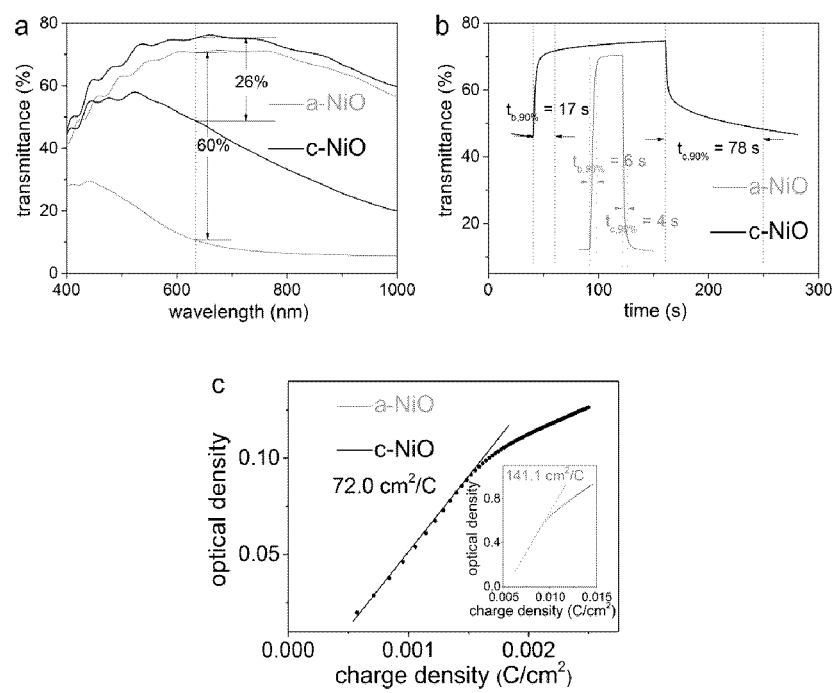
FIG. 23 depict the result of characterizing and comparing performances of EC devices using amorphous and crystalline nickel oxides as counter electrodes, prepared in accordance with an embodiment of the present invention

Example 18: Comparison of Solid State EC Devices Prepared Using Amorphous and Crystalline NiO as Counter Electrodes FIG. 23a shows a comparison of transmittance spectra of EC devices prepared using a-$NiO_x$ and c-NiO films prepared using the present methods as counter electrodes at colored and bleached state. The spectra were recorded after coloring at −2.1 V and bleaching at +2.1 V for 60 s. FIG. 23b depicts the transmittance change at wavelength of 633 nm for the EC devices with a-$NiO_x$ and c-NiO on FTO as counter electrode as a function of time. The devices were bleached at +2.1 V for 30 s, then colored at −2.1 V for another 30 s. Switch times are indicated. FIG. 23c depicts the changes in optical density of the respective devices at 633 nm as a function of charge density using a-$NiO_x$ and c-NiO on FTO as counter electrode. Coloration efficiency values were determined by fitting the linear region of the plot.

Example 19: Comparison of Solid State Devices of the Present Invention with Prior Art Devices All devices listed in Table 5 use $WO_3$ films as electrochromic layers, NiO films as ion storage layer, and polymer-based electrolyte. The present work clearly demonstrates that the amorphous NiO films formed in accordance with the present invention show superior performance to its crystalline counterpart, which has never been previously documented. The methods of the present invention also represent a significant advancement towards using solution-processing methods for deposition of metal oxide films for use in solid state electrochromic windows.

TABLE 5

Performance parameters of our solid state electrochromic devices in comparison to that of solid-state devices reported in the literatures

| Counter electrode material | Phase | Deposition method | $\Delta T^a$ (%) | $t_{c,90\%}{}^b$ (s) | $t_{b,90\%}{}^c$ (s) | $CE^d$ (cm²/C) | Reference |
|---|---|---|---|---|---|---|---|
| NiO porous film | crystalline | chemical bath deposition | 55% | 10 | 20 | 87.2 | Zhang et al.[e] |
| NiO nanoparticle film | crystalline | inkjet printing | 75% | 10 | 13 | 131.9 | Cai et al.[f] |
| $NiO_x$ film | crystalline | magnetron sputtering | 52% | 5 | 2 | — | Liu et al.[g] |

TABLE 5-continued

Performance parameters of our solid state electrochromic devices in comparison to that of solid-state devices reported in the literatures

| Counter electrode material | Phase | Deposition method | $\Delta T^a$ (%) | $t_{c,90\%}{}^b$ (s) | $t_{b,90\%}{}^c$ (s) | $CE^d$ (cm$^2$/C) | Reference |
|---|---|---|---|---|---|---|---|
| NiO film | amorphous | UV | 60% | 4 | 6 | 141.1 | this work[h] |
| NiO film | crystalline | UV | 26% | 78 | 17 | 72.0 | this work[h] |

[a]Maximum optical modulation ($\Delta T$) determined by the light transmittance difference between fully colored and bleached states at a specific wavelength
[b]Switching time of coloring ($t_{c,90\%}$) defined by the time required to reach 90% of a full transmittance change from the bleached to colored state.
[c]Switching time of bleaching ($t_{b,90\%}$) from the colored to bleached state.
[d]Coloration efficiency (CE) defined as the change in optical density acquired by injection of charge per unit area
[e]Measured in a potential range from −2.5 V to +2.5 V, at wavelength of 633 nm
[f]Measured in a potential range from −2.5 V to +2.5 V, at wavelength of 550 nm
[g]Measured in a potential range from −1.8 V to +1.8 V, at wavelength of 550 nm
[h]Measured in a potential range from −2.1 V to +2.1 V, at wavelength of 633 nm Example 20: Photodeposition of Electrochromic Films on Tin-Doped Indium Oxide (ITO) Coated Polyethylene Terephthalate (PET)

The methods of the present invention have also been demonstrated as useful for deposition of metal oxide films on flexible substrates.

A precursor solution was prepared by rotary evaporating 4 ml of tungsten(VI) isopropoxide 5% w/v in isopropanol to approximately 2 ml. Then, 0.152 ml acetylacetone was added to the tungsten(VI) isopropoxide solution. After 30 min, the precursor solutions were spin-coated onto ITO-PET substrates at 3000 rpm for 60 s (Laurell model WS-650MZ-23NPP-Lite). The resultant precursor thin films were subjected to UV (Atlantic Ultraviolet G18T5VH/U; $\lambda_{max}$=185) irradiation until complete decomposition of organic ligands confirmed by FTIR analyses. To produce multi-layer thin films, the spin-coating and UV light irradiation steps were repeated multiple times. The as-deposited films were annealed in an oven (Ney Vulcan 3-550) in air at 100° C. for 1 hour.

The electrochromic properties were measured in a spectroelectrochemical cell that has a three electrodes configuration. WO$_3$ film on ITO-PET was used as working electrode, Ag/AgCl as reference electrode, and Pt as counter electrode. 1 M-LiClO$_4$ propylene carbonate was used as electrolyte. The optical properties were recorded by PerkinElmer Lambda 35 UV-Vis spectrophotometer. The potentials were applied by a CHI660D potentiostat.

Figure 26:
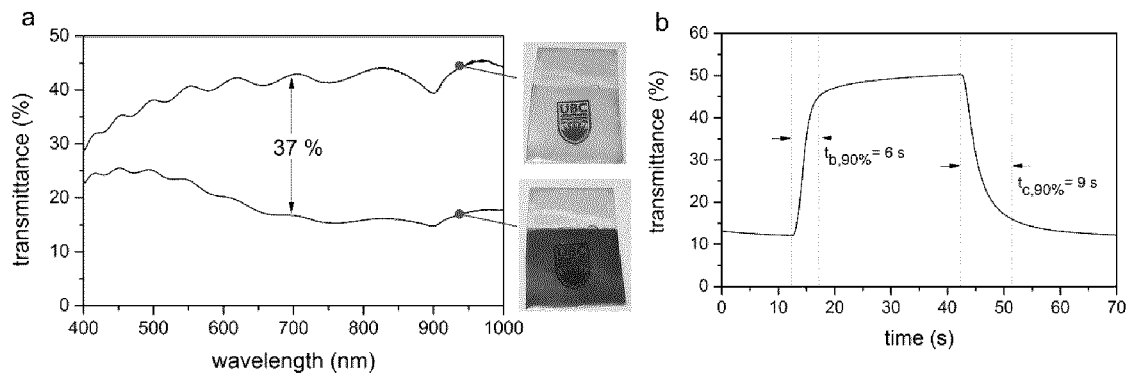
FIG. 26 depicts transmittance data for a $WO_3$ film on tin-doped indium oxide (ITO) coated polyethylene terephthalate (PET), prepared in accordance with the present invention.

FIG. 26a shows the transmittance spectra of coloured and bleached WO$_3$ on ITO-coated PET plastic substrate after holding the potential at −/+0.7 V (vs Ag/AgCl) for 60 seconds. The photographs are the photodeposited WO$_3$ film on ITO-PET substrate at bleached and colored states.

FIG. 26b shows the transmittance change at 700 nm as a function of time. The WO$_3$ film was held at potential of +0.7 V for 30 s and followed by another 30 seconds at −0.7 V. Switching times are indicated.

Example 21: Effect of Nb Doping on WO$_3$ Film Performance

For the synthesis of WO$_3$ film, a 0.25 M WCl$_6$ isopropanol precursor solution was prepared by dissolving 0.200 g WCl$_6$ in 2 ml of 2-propanol. The precursor solution for the 10% Nb-doped WO$_3$ was prepared by adding 0.43 ml of the 0.1 M NbCl$_5$ ethanol solution into 1.57 ml of 0.25 M WCl$_6$ isopropanol solution. The precursor solutions were then spin-coated on FTO glass at 3000 rpm for 60 s (Laurell model WS-650MZ-23NPP-Lite). The resultant precursor thin films were subjected to UV (Atlantic Ultraviolet G18T5VH/U; $\lambda_{max}$=185) irradiation for 15 min. To produce multi-layer thin films, the spin-coating and UV light irradiation steps were repeated multiple times. The as-deposited films were annealed in an oven (Ney Vulcan 3-550) in air at 100° C. for 1 hour.

The electrochromic properties were measured in a spectroelectrochemical cell that has a three electrodes configuration. Doped or undoped WO$_3$ film on FTO glass was used as working electrode, Ag/AgCl as reference electrode, and Pt as counter electrode. 1 M-LiClO$_4$ propylene carbonate was used as electrolyte. The optical properties were recorded by PerkinElmer Lambda 35 UV-Vis spectrophotometer. The potentials were applied by a CHI660D potentiostat.

FIG. 26a shows a comparison of the transmittance spectra for undoped WO$_3$ (black) and Nb-doped WO$_3$ (grey) on FTO glass after holding the potential at −0.8 V (coloring) and −0.8 V (bleaching) (vs Ag/AgCl) for 60 seconds. FIG. 26b shows a comparison of the tansmittance change as a function of time over 10 electrochromic cycles for undoped WO$_3$ (black) and Nb-doped WO$_3$ (grey). In each cycle the films were held at −0.8 V (vs Ag/AgCl) for 30 seconds followed by another 30 seconds at +0.8 V.

Example 22: Effect of Ti Doping on WO$_3$ Film Performance

A 0.25 M WCl$_6$ isopropanol precursor solution was prepared by dissolving 0.200 g WCl$_6$ in 2 ml 2-propanol. A 0.25 M Ti(IV) 2-ethylhexanoate precursor solution was prepared by dissolving 0.282 g Ti (IV) 2-ethylhexanoate in 2 ml 2-propanol. The precursor solutions for the 1%, 5%, 10% Ti-doped WO$_3$ were prepared by mixing 0.02 ml, 0.10 ml, and 0.20 ml 0.25 M Ti(IV) 2-ethylhexanoate isopropanol solutions with 1.98 ml, 1.9 ml, and 1.8 ml 0.25 M WCl$_6$ isopropanol solutions respectively. The precursor solutions were then spin-coated on FTO glass at 3000 rpm for 60 s (Laurell model WS-650MZ-23NPP-Lite). The resultant precursor thin films were subjected to UV (Atlantic Ultraviolet G18T5VH/U; $\lambda_{max}$=185) irradiation for 10 min. To produce multi-layer thin films, the spin-coating and UV light irradiation steps were repeated multiple times. The as-deposited films were annealed in an oven (Ney Vulcan 3-550) in air at 100° C. for 1 hour.

The electrochromic properties were measured in a spectroelectrochemical cell that has a three electrodes configuration. Doped or undoped WO$_3$ film on FTO glass was used as working electrode, Ag/AgCl as reference electrode, and Pt as counter electrode. 1 M-LiClO$_4$ propylene carbonate was used as electrolyte. The optical properties were recorded by PerkinElmer Lambda 35 UV-Vis spectrophotometer. The potentials were applied by a CHI660D potentiostat.

Figure 27:
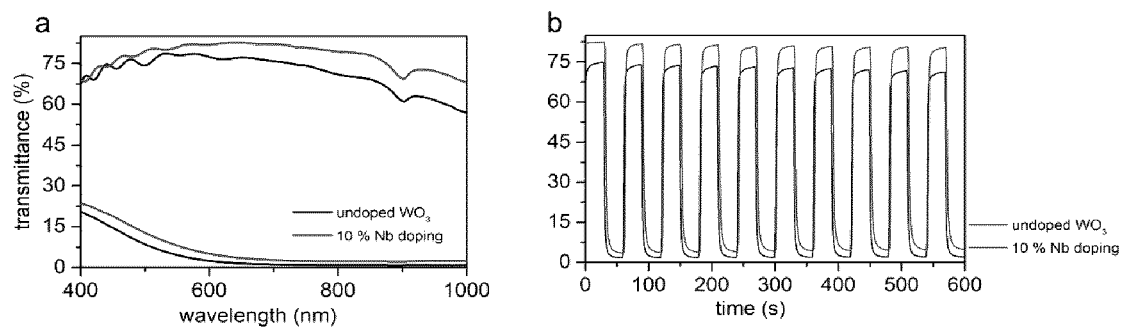
FIG. 27 depicts transmittance data for undoped $WO_3$ and Nb-doped $WO_3$ films on FTO glass, prepared in accordance with the present invention.
Figure 28:
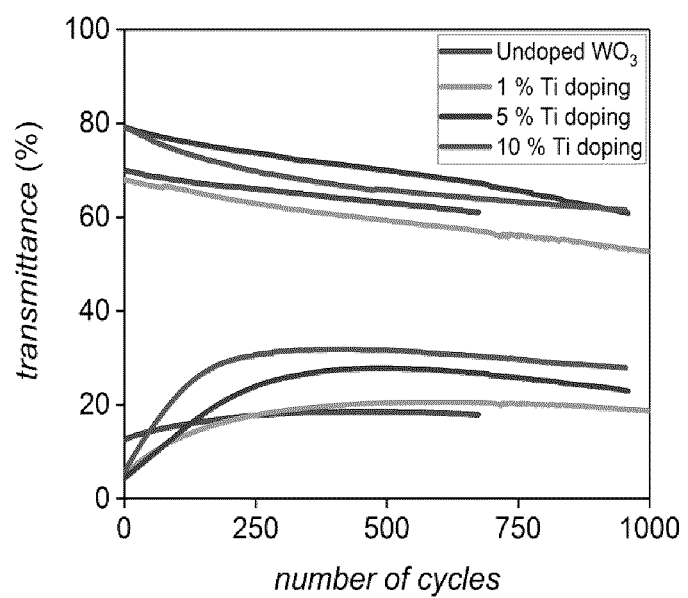
FIG. 28, depicts transmittance data for undoped $WO_3$ and Ti-doped $WO_3$ films on FTO glass prepared in accordance with the present invention

FIG. 27 depicts the maximum and minimum transmittance over 1000 cycles for undoped and Ti-doped $WO_3$ films. In each cycle the films were held at −0.8 V (vs Ag/AgCl) for 30 seconds followed by another 30 seconds at +0.8 V.

REFERENCES

Articles

Smith, R. D., Prévot, M. S., Fagan, R. D., Zhang, Z., Sedach, P. A., Siu, M. K. J., Trudel, S., Berlinguette, C. P., Photochemical route for accessing amorphous metal oxide materials for water oxidation catalysis. *Science*, 2013, 340, 60.

Salvatore, D. A., Dettelbach, K. E., Hudkins, J. R., Berlinguette, C. P., Near-Infrared-Driven Decomposition of Metal Precursors Drives the Formation of Amorphous Metal and Metal Oxide Films. *Science Advances*, 2015, 1, e1400215.

Passerini, S., Scrosati, B., Gorenstein, A., Andersson, A., & Granqvist, C., An electrochromic window based on Li (x) $WO_3$/(PEO) $8LiClO_4$/NiO. *Journal of the Electrochemical Society*, 1989, 136, 3394.

Wen, R-T., Granqvist, C. G., Niklasson, G. A., Anodic Electrochromism for Energy-Efficient Windows: Cation/Anion-Based Surface Processes and Effects of Crystal Facets in Nickel Oxide Thin Films. *Advanced Functional Materials*, 2015, 25, 3359.

Mahmoud, S., Aly, S., Abdel-Rahman, M., & Abdel-Hady, K., Electrochromic characterisation of electrochemically deposited nickel oxide films. *Physica B: Condensed Matter*, 2000, 293, 125.

Svensson, J., & Granqvist, C., Electrochromic hydrated nickel oxide coatings for energy efficient windows: optical properties and colouration mechanism. *Applied Physics Letters*, 1986, 49, 1566.

Mortimer, R. J., Electrochromic materials. *Annual Reviews of Materials Research*, 2011, 41, 241.

Wen, R., Niklasson, G. A., & Granqvist, C. G., Electrochromic nickel oxide films and their compatibility with potassium hydroxide and lithium perchlorate in propylene carbonate: Optical, electrochemical and stress-related properties. *Thin Solid Films*, 2014, 565, 128.

Estrada, W., Andersson, A. M., & Granqvist, C. G., Electrochromic nickel-oxide-based coatings made by reactive dc magnetron sputtering: Preparation and optical properties. *Journal of Applied Physics*, 1988, 64, 3678.

Wen, R., Niklasson, G. A., & Granqvist, C. G., Electrochromic performance of Ni oxide thin films intercalated with $Li^+$ ions. *Journal of Physics: Conference Series*, 2014, 559, 012006.

Dalavi, D. S., Devan, R. S., Patil, R. S., Ma, Y., & Patil, P. S., Electrochromic performance of sol-gel deposited NiO thin film. *Materials Letters*, 2013, 90, 60.

Niklasson, G. A., & Granqvist, C. G., Electrochromics for smart windows: thin films of tungsten oxide and nickel oxide, and devices based on these. *Journal of Materials Chemistry*, 2007, 17, 127.

Chiang, K., & Wu, J., Fuel-Assisted Solution Route to Nanostructured Nickel Oxide Films for Electrochromic Device Application. *ACS Applied Materials & Interfaces*, 2013, 5, 6502.

Gillaspie, D. T., Tenent, R. C., & Dillon, A. C., Metal-oxide films for electrochromic applications: present technology and future directions. *Journal of Materials Chemistry*, 2010, 20, 9585.

Runnerstrom, E. L., Llordes, A., Lounis, S. D. & Milliron, D. J., Nanostructured electrochromic smart windows: traditional materials and NIR-selective plasmonic nanocrystals. *Chemical Communications*, 2014, 50, 10555.

Srivastava, A. K., Deepa, M., Singh, S., Kishore, R. & Agnihotry, S. A., Microstructural and electrochromic characteristics of electrodeposited and annealed $WO_3$ films. *Solid State Ionics*, 2005, 176, 1161.

Azens, A., Kullman, L., & Granqvist, C., Ozone coloration of Ni and Cr oxide films. *Solar Energy Materials and Solar Cells*, 2003, 76, 147.

Wu, W., Wu, J., & Chen, J., Resistive Switching Behavior and Multiple Transmittance States in Solution-Processed Tungsten Oxide. *ACS Applied Materials & Interfaces*, 2011, 3, 2616.

Nakaoka, K., Ueyama, J., & Ogura, K., Semiconductor and electrochromic properties of electrochemically deposited nickel oxide films. *Journal of Electroanalytical Chemistry*, 2004, 571, 93.

Livage, J., & Ganguli, D., Sol-gel electrochromic coatings and devices: a review. *Solar Energy Materials and Solar Cells*, 2001, 68, 365.

Azens, A., Kullman, L., Vaivars, G., Nordborg, H., & Granqvist, C., Sputter-deposited nickel oxide for electrochromic applications. *Solid State Ionics*, 1998, 113, 449.

Cheng, W., Baudrin, E., Dunn, B., & Zink, J. I., Synthesis and electrochromic properties of mesoporous tungsten oxide. *Journal of Materials Chemistry*, 2001, 11, 92.

Decker, F., Passerini, S., Pileggi, R., & Scrosati, B., The electrochromic process in non-stoichiometric nickel oxide thin film electrodes. *Electrochimica Acta*, 1992, 37, 1033.

Passerini, S., Scrosati, B., & Gorenstein, A., The intercalation of lithium in nickel oxide and its electrochromic properties. *Journal of the Electrochemical Society*, 1990, 137, 3297.

Korošec, R. C., & Bukovec, P., The role of thermal analysis in optimization of the electrochromic effect of nickel oxide thin films, prepared by the sol-gel method: Part II. *Thermochimica Acta*, 2004, 410, 65.

Liang, L., Zhang, J., Zhou, Y., Xie, J., Zhang, X., Guan, M., Pan, B., & Xie, Y. High-performance flexible electrochromic device based on facile semiconductor-to-metal transition realized by $WO_3.2H_2O$ ultrathin nanosheets. *Scientific Reports*, 2013, 3, 1936.

Liao, C.-C., Chen, F.-R. & Kai, J.-J., $WO_{3-x}$ nanowires based electrochromic devices. *Solar Energy Materials and Solar Cells*, 2006, 90, 1147.

Zhang, J., Tu, J.-p., Xia, X.-h., Wang, X.-l. & Gu, C.-d., Hydrothermally synthesized $WO_3$ nanowire arrays with highly improved electrochromic performance. *Journal of Materials Chemistry*, 2011, 21, 5492.

Brezesinski, T., Fattakhova Rohlfing, D., Sallard, S., Antonietti, M. & Smarsly, B. M., Highly crystalline $WO_3$ thin films with ordered 3D mesoporosity and improved electrochromic performance. *Small* 2006, 2, 1203.

Liu, J.-W., Zheng, J., Wang, J.-L., Xu, J., Li, H.-H. & Yu, S.-H., Ultrathin $W_{18}O_{49}$ nanowire assemblies for electrochromic devices. *Nano Letters*, 2013, 13, 3589.

Scherer, M. R. J., Li, L., Cunha, P. M. S., Scherman, O. A. & Steiner, U., Enhanced electrochromism in gyroid-structured vanadium pentoxide. *Advanced Materials*, 2012, 24, 1217.

Tong, Z., Lv, H., Zhang, X., Yang, H., Tian, Y., Li, N., Zhao, J., & Li, Y., Novel morphology changes from 3D ordered macroporous structure to $V_2O_5$ nanofiber grassland and its application in electrochromism. *Scientific Reports*, 2015, 5, 16864.

Llordes, A., Wang, Y., Fernandez-Martinez, A., Xiao, P., Lee, T., Poulain, A., Zandi, O., Saez Cabezas, C. A., Henkelman, G., & Milliron, D. J., Linear topology in amorphous metal oxide electrochromic networks obtained via low-temperature solution processing. *Nature Materials*, 2016, 15, 1267.

Maruyama, T. & Kanagawa, T., Electrochromic properties of molybdenum trioxide thin films prepared by chemical vapor deposition. *Journal of the Electrochemical Society*, 1995, 142, 1644.

Hsu, C.-S., Chan, C.-C., Huang, H.-T., Peng, C.-H. & Hsu, W.-C. Electrochromic properties of nanocrystalline $MoO_3$ thin films. *Thin Solid Films*, 2008, 516, 4839.

Qirong Liu, Guobo Dong, Yu Xiao, Marie-Paule Delplancke-Ogletree, François Reniers, Xungang Diao, Electrolytes-relevant cyclic durability of nickel oxide thin films as an ion-storage layer in an all-solid-state complementary electrochromic device, *Solar Energy Materials and Solar Cells*, 2016, 157, Pages 844-852.

J. Zhang, J. P. Tu, X. H. Xia, Y. Qiao, Y. Lu, An all-solid-state electrochromic device based on $NiO/WO_3$ complementary structure and solid hybrid polyelectrolyte, *Solar Energy Materials and Solar Cells*, Volume 93, Issue 10, 2009, 1840-1845.

G. Cai, P, Darmawan, M. Cui, J. Chen, X. Wang, A. L.-S. Eh, S. Magdassi and P. S. Lee, Inkjet-printed all solid-state electrochromic devices based on $NiO/WO_3$ nanoparticle complementary electrodes, *Nanoscale*, 2016, 8, 348-357

Patents

Tseung, A. C. C., Shen, P. K., Syed-Bokhari, J. (1992). Electrochromic and Electrocatalytic Material. U.S. Pat. No. 5,470,673. Washington, D.C.: U.S.

Gillaspie, D. T., Weir, D. G. (2013). Electrochromic Nickel Oxide Simultaneously Doped with Lithium and a Metal Dopant. U.S. Pat. No. 8,687,261. Washington, D.C.: U.S.

Jiang, C., Kwak, B. S. L. (2014). Electrochromic Tungsten Oxide Film Deposition. U.S. Pat. No. 8,894,827. Washington, D.C.: U.S.

Hutchins, M. G., McMeeking, G. (1991) Making Electrochromic Films. EP0493043. Paris: France.

Brand, W. L. (1972). Method of Vapor Depositing A Tungsten-Tungsten Oxide Coating. U.S. Pat. No. 3,669,724. Washington, D.C.: U.S.

Weir, D. G., Engtrakul, C., Lin, F. (2014). Ternary Nickel Oxide Materials For Electrochromic Devices. WO2014/025876. Washington, D.C.: U.S.

Bailey, J. A., Budd, K. D., Tran, T. T. (1998). Process for Producing Tungsten Oxide. U.S. Pat. No. 5,772,978. Washington, D.C.: U.S.

Tambo, F. (1995). Tungsten Oxide Film, Process for Producing Same and Electrochromic Device Using Same. U.S. Pat. No. 5,384,157. Washington, D.C.: U.S.

Burdis, M. S., Weir, D. G. J. (2013). Electrochromic Devices and Methods U.S. patent application Ser. No. 13/895,680. Washington, D.C.: U.S.

Milliron, D., Llordes, A., Buonsanti, R., Garcia, G. (2014). Electrochromic Nanocomposite Films. U.S. patent application Ser. No. 14/234,610. Washington, D.C.: U.S.

Moser, F. H., Lynam, N. R. (1991). Method for Deposition of Electrochromic Layers. U.S. Pat. No. 4,996,083. Washington, D.C.: U.S.

Lee, S.-H., Tracy, E., Pitts, R., Jorgensen, G. J. (2005). Electrochromic Counter Electrode. U.S. Pat. No. 6,859, 297 B2. Washington, D.C.: U.S.

Jang, K. S., Park, J. D., Oh, J. S., Park, J. Y., Choi, S. J., Kwon, W. J., Lee, B. B. (2009). Electrode Comprising Lithium Nickel Oxide Layer, Method for Preparing the Same, and Electrochromic Device Comprising the Same. U.S. Pat. No. 7,564,611 B2. Washington, D.C.: U.S.

Wang, Z., Kurman, E., Kozlowski, M., Scobey, M., Dixon, J., Pradhan, A. (2013). Electrochromic Devices. U.S. Pat. No. 8,432,603 B2. Washington, D.C.: U.S.

What is claimed:

1. A process for forming an electrochromic material suitable for use in an electrochromic device, the process comprising:
   providing a transparent conductive substrate;
   coating the transparent conductive substrate with a solution of one or more metal precursors, wherein a metal precursor comprises a ligand selected from chloride, bromide and nitrate and is converted to a metal oxide upon exposure to UV radiation and/or ozone; and
   exposing the coated transparent conductive substrate to UV radiation and/or ozone in an aerobic atmosphere at ambient temperature and ambient pressure to effect conversion of the one or more metal precursors to a metal oxide film on the transparent conductive substrate without application of a heat treatment with an external heat source, thereby forming the electrochromic material,
   wherein the electrochromic device comprises:
   a first electrode comprising the electrochromic material,
   a counter electrode, and
   an ion-conductor layer for conducting ions between the first electrode and the counter electrode.

2. The process according to claim 1, further comprising annealing the metal oxide film, wherein annealing is carried out at a temperature of about 50° C. to about 750° C.

3. The process according to claim 1, further comprising annealing the metal oxide film, wherein the annealing is carried out at about 100° C., 200° C. or 600° C. for 1 hour.

4. The process according to claim 1, wherein the metal oxide film comprises a metal oxide selected from the group consisting of $NiO_x$, $WO_x$, $NbO_x$, $MoO_x$, $MnO_x$, $CoO_x$, $VO_x$, $TaO_x$, $TiO_x$, $FeO_x$, $IrO_x$, and combinations thereof, a mixed metal oxide selected from $LiNiO_x$, $TiWO_x$, and $FeNiO_x$, or a doped metal oxide selected from Nb doped $WO_3$ and Ti doped $WO_3$.

5. The process according to claim 4, wherein the metal oxide film comprises WO3.

6. The process according to claim 1, wherein the transparent conductive substrate is formed of a conductive material.

7. The process according to claim 1, wherein the transparent conductive substrate is formed of a transparent material coated with a conductive film.

8. The process according to claim 7, wherein the transparent conductive substrate is a substrate coated with fluorine tin oxide (FTO), indium tin oxide (ITO), or aluminum zinc oxide (AZO).

9. The process according to claim 1, wherein coating and exposing are repeated until a desired thickness of the metal oxide film is achieved.

10. The process according to claim 1, wherein the metal oxide film is an amorphous metal oxide film.

11. The process according to claim 1, wherein the metal oxide film is a crystalline metal oxide film.

12. The process according to claim 1, wherein the first electrode comprises FTO glass coated with an amorphous $WO_3$ film.

13. The process according to claim 1, wherein the counter electrode comprises bare FTO glass.

14. The process according to claim 1, wherein the metal oxide film is a first metal oxide film and the counter electrode comprises FTO glass coated with a second metal oxide film prepared using the process as defined in claim 1.

15. The process according to claim 14, wherein the counter electrode comprises FTO glass coated with $NiO_x$ or $TiO_x$.

16. The process according to claim 1, wherein the ion-conductor layer is an electrolytic solution.

17. The process according to claim 16, wherein the electrolytic solution is a $LiClO_4$-propylene carbonate electrolyte solution.

18. The process according to claim 1, wherein the electrochromic device is a solid-state device and the ion-conductor layer is an electrolytic gel.

19. The process according to claim 18, wherein the ion-conductor layer is $LiClO_4$-propylene carbonate-poly(methyl methacrylate) gel electrolyte.

20. The process according to claim 7, wherein the transparent conductive substrate is indium tin oxide (ITO) coated polyethylene terephthalate (PET).

\* \* \* \* \*